United States Patent
Huang et al.

(10) Patent No.: US 12,230,215 B2
(45) Date of Patent: Feb. 18, 2025

(54) DISPLAY SUBSTRATE, MANUFACTURING METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Pinchao Gu, Beijing (CN); Binyan Wang, Beijing (CN); Tianyi Cheng, Beijing (CN); Hongjun Zhou, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/039,722

(22) PCT Filed: Dec. 28, 2021

(86) PCT No.: PCT/CN2021/142168
§ 371 (c)(1),
(2) Date: Jun. 1, 2023

(87) PCT Pub. No.: WO2023/122980
PCT Pub. Date: Jul. 6, 2023

(65) Prior Publication Data
US 2024/0379062 A1    Nov. 14, 2024

(51) Int. Cl.
*G09G 3/32*     (2016.01)
*G09G 3/3266*   (2016.01)
(Continued)

(52) U.S. Cl.
CPC ....... *G09G 3/3266* (2013.01); *H10K 59/1201* (2023.02); *H10K 59/131* (2023.02); *G09G 2300/0842* (2013.01); *G09G 2310/08* (2013.01)

(58) Field of Classification Search
CPC .. H01L 27/32; H10K 59/131; H10K 59/1201; G09G 3/3266; G09G 3/3225; G09G 2300/0842; G09G 2310/08
See application file for complete search history.

(56) References Cited

U.S. PATENT DOCUMENTS

| | | | |
|---|---|---|---|
| 2020/0119127 | A1 | 4/2020 | Tian et al. |
| 2020/0342808 | A1 | 10/2020 | Han et al. |

(Continued)

FOREIGN PATENT DOCUMENTS

| | | |
|---|---|---|
| CN | 108598118 A | 9/2018 |
| CN | 110690365 A | 1/2020 |

(Continued)

OTHER PUBLICATIONS

International Search Report for PCT/CN2021/142168 Mailed Aug. 22, 2022.

(Continued)

*Primary Examiner* — Michael A Faragalla
(74) *Attorney, Agent, or Firm* — Ling Wu; Stephen Yang; Ling and Yang Intellectual Property

(57) ABSTRACT

A display substrate, a manufacturing method therefor, and a display apparatus are provided. The display substrate includes a display area (100) and a bezel area (300), the bezel area (300) includes a circuit area (310) and a partition area (320), the circuit area (310) includes a third gate driving circuit, a second gate driving circuit (GOA-2) and a first gate driving circuit (GOA-1) arranged in sequence along a direction away from the display area (100), the partition area (Continued)

(320) includes a power supply line, the power supply line includes a first branch (VSS-1) and a second branch (VSS-2); orthographic projections of the second branch (VSS-2) and the first branch (VSS-1) of the power supply line on the base substrate have an overlapped area.

20 Claims, 17 Drawing Sheets

(51) Int. Cl.
*H10K 59/12* (2023.01)
*H10K 59/131* (2023.01)

(56) References Cited

U.S. PATENT DOCUMENTS

| | | | |
|---|---|---|---|
| 2021/0202589 A1* | 7/2021 | Jo | ................ H10K 59/131 |
| 2021/0399079 A1 | 12/2021 | Yan et al. | |
| 2022/0165833 A1 | 5/2022 | Li et al. | |
| 2022/0310772 A1 | 9/2022 | Qing et al. | |
| 2023/0329037 A1 | 10/2023 | Zhao et al. | |

FOREIGN PATENT DOCUMENTS

| | | |
|---|---|---|
| CN | 112490271 A | 3/2021 |
| CN | 112599540 A | 4/2021 |
| CN | 113066434 A | 7/2021 |
| CN | 113097263 A | 7/2021 |
| CN | 113253530 A | 8/2021 |
| CN | 113270427 A | 8/2021 |
| CN | 113284543 A | 8/2021 |
| CN | 113393792 A | 9/2021 |
| CN | 113410277 A | 9/2021 |
| WO | 2020155844 A1 | 8/2020 |

OTHER PUBLICATIONS

Abidur Rahaman et al. "LTPO TFT Technology for Level Shifter Integrated Gate Driver in UHD 4K Displays", SID 2020 Digest, pp. 363-366.

* cited by examiner

DISPLAY SUBSTRATE, MANUFACTURING METHOD THEREFOR, AND DISPLAY APPARATUS

CROSS-REFERENCE TO RELATED APPLICATION

The present application is a U.S. National Phase Entry of International Application No. PCT/CN2021/142168 having an international filing date of Dec. 28, 2021. The above-identified application is hereby incorporated by reference.

TECHNICAL FIELD

Embodiments of the present disclosure relate to, but are not limited to, the field of display technologies, in particular to a display substrate and a method for manufacturing the display substrate, and a display apparatus.

BACKGROUND

An Organic Light Emitting Diode (OLED for short) and a Quantum-dot Light Emitting Diode (QLED for short) are active light emitting display devices and have advantages such as self-luminescence, wide viewing angle, high contrast ratio, low power consumption, very high response speed, lightness and thinness, flexibility, and low costs. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

The embodiment of the present disclosure provides a display substrate including a display area and a bezel area located on at least one side of the display area, wherein the bezel area includes a circuit area and a partition area sequentially arranged along a direction away from the display area, the circuit area includes a third gate driving circuit, a second gate driving circuit and a first gate driving circuit sequentially arranged along a direction away from the display area, the partition area includes a power supply line, the power supply line includes a first branch and a second branch; in a plane perpendicular to a display substrate, the display substrate includes a first semiconductor layer, a first conductive layer, a second conductive layer, a second semiconductor layer, a third conductive layer, a fourth conductive layer, and a fifth conductive layer that are sequentially disposed on a base substrate, wherein the first semiconductor layer includes active layers of a plurality of polysilicon transistors, the first conductive layer includes gate electrodes of a plurality of polysilicon transistors and a first plate of a storage capacitor, the second conductive layer includes a second plate of the storage capacitors, the second semiconductor layer includes active layers of a plurality of oxide transistors, the third conductive layer includes gate electrodes of a plurality of oxide transistors, the fourth conductive layer includes first electrodes and second electrodes of a plurality of polysilicon transistors, first electrodes and second electrodes of a plurality of oxide transistors and the first branch of the power supply line, the fifth conductive layer includes the second branch of the power supply line; an orthographic projection of the second branch of the power supply line on the base substrate and an orthographic projection of the first branch of the power supply line on the base substrate have an overlapped area, and the orthographic projection of the second branch of the power supply line on the base substrate and an orthographic projection of the first gate driving circuit on the base substrate have an overlapped area; the orthographic projection of the first branch of the power supply line on the base substrate and the orthographic projection of the first gate driving circuit on the base substrate does not have an overlapped area.

In an exemplary implementation, the orthographic projection of the second branch of the power supply line on the base substrate and an orthographic projection of the second gate driving circuit on the base substrate does not have an overlapped area.

In an exemplary implementation, the second branch of the power supply line includes a plurality of exhaust openings arranged at intervals, and an orthographic projection of the plurality of exhaust openings on the base substrate has an overlapped area with the orthographic projections of the first branch of the power supply line and the first gate driving circuit on the base substrate.

In an exemplary implementation, an area of the orthographic projection of the exhaust opening on the base substrate is 5% to 15% of an area of the orthographic projection of the second branch of the power supply line on the base substrate.

In an exemplary implementation, the first gate driving circuit and the second gate driving circuit respectively include a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a first capacitor, a second capacitor, and a third capacitor;

a gate electrode of the first transistor, a first electrode of the second transistor and a gate electrode of the third transistor are all electrically connected with the first clock signal line, a first electrode of the first transistor is electrically connected with an input terminal, a second electrode of the first transistor is electrically connected with a gate electrode of the second transistor, a gate electrode of the eighth transistor, a first electrode of the twelfth transistor and a first electrode of the thirteenth transistor;

a second electrode of the second transistor is electrically connected with a second electrode of the third transistor, a gate electrode of the fifth transistor, and a first electrode of the eleventh transistor;

a first electrode of the third transistor, a first electrode of the tenth transistor, a gate electrode of the eleventh transistor and a gate electrode of the twelfth transistor are all electrically connected with a second low voltage line;

a gate electrode of the fourth transistor is electrically connected with a second electrode of the twelfth transistor, a gate electrode of the tenth transistor and a first plate of the third capacitor, and a second electrode of the fourth transistor, a first electrode of the sixth transistor and a gate electrode of the seventh transistor are electrically connected with a second clock signal line;

a first electrode of the fifth transistor, a first electrode of the eighth transistor, a first electrode of the ninth transistor, a second electrode of the thirteenth transistor and a second plate of the second capacitor are all electrically connected with a first high voltage line, and a second electrode of the fifth transistor is electrically connected with a first electrode of the fourth transistor and a second plate of the third capacitor;

a gate electrode of the sixth transistor is electrically connected with a first electrode plate of the first capacitor and a second electrode of the eleventh transistor, and a second electrode of the sixth transistor is electrically connected with a second electrode plate of the first capacitor and a first electrode of the seventh transistor;

a second electrode of the seventh transistor is electrically connected with a second electrode of the eighth transistor, a gate electrode of the ninth transistor and a first plate of the second capacitor; a second electrode of the ninth transistor and a second electrode of the tenth transistor are electrically connected with an output terminal; a gate electrode of the thirteenth transistor is electrically connected with a third clock signal line.

In an exemplary implementation, the first high voltage line includes a first branch and a second branch, and the second low voltage line includes a first branch, a second branch, a third branch, and a fourth branch;

the first branch of the first high voltage line, the first branch of the second low voltage line, and the second branch of the second low voltage line are arranged in the same layer as the fourth conductive layer; the second branch of the first high voltage line, the third branch of the second low voltage line, and the fourth branch of the second low voltage line are arranged in the same layer as the fifth conductive layer.

In an exemplary implementation, the first conductive layer includes a first connection electrode, and the fourth conductive layer includes a third connection electrode, a fourth connection electrode, and a fifth connection electrode;

the first connection electrode is connected with the gate electrode of the second transistor and the gate electrode of the eighth transistor to form an integrated structure; the third connection electrode and the first electrode of the thirteenth transistor are connected with each other to form an integrated structure, the fourth connection electrode and the second electrode of the first transistor are connected with each other to form an integrated structure, and the fifth connection electrode and the first electrode of the twelfth transistor are connected with each other to form an integrated structure;

the first connection electrode is connected with the third connection electrode, the fourth connection electrode and the fifth connection electrode through a via, respectively.

In an exemplary implementation, in the first gate driving circuit, the third connection electrode is L-shaped.

In an exemplary implementation, the third clock signal line is arranged in the same layer as the fourth conductive layer, the third clock signal line includes a first protrusion connected with the gate electrode of the thirteenth transistor through a via;

the active layer of the thirteenth transistor includes a channel area. In the first gate driving circuit, a via through which the first protrusion is connected with the gate electrode of the thirteenth transistor and a via through which the first connection electrode is connected with the third connection electrode are respectively located at both sides of the channel area of the thirteenth transistor.

In an exemplary implementation, in the second gate driving circuit, the third connection electrode is in a shape of "1".

In an exemplary implementation, the third clock signal line is arranged in the same layer as the fourth conductive layer, the third clock signal line includes a first protrusion connected with the gate electrode of the thirteenth transistor through a via;

the active layer of the thirteenth transistor includes a channel area, in the second gate driving circuit, a via through which the first protrusion is connected with the gate electrode of the thirteenth transistor and a via through which the first connection electrode is connected with the third connection electrode are located at the same side of the channel area of the thirteenth transistor.

In an exemplary implementation, the ninth transistor includes a plurality of gate electrodes arranged in parallel and at intervals, the tenth transistor includes a plurality of gate electrodes arranged in parallel and at intervals, the number of gate electrodes of the ninth transistor in the second gate driving circuit is greater than the number of gate electrodes of the ninth transistor in the first gate driving circuit; the number of gate electrodes of the tenth transistor in the second gate driving circuit is smaller than the number of gate electrodes of the tenth transistor in the first gate driving circuit.

In an exemplary implementation, in the second gate driving circuit, a length of each gate electrode of the ninth transistor along a first direction is between 30% and 40% of a width of the second gate driving circuit along the first direction, and a width of each gate electrode of the ninth transistor along a second direction is between 2% and 3% of a width of the second gate driving circuit along the first direction.

In an exemplary implementation, the bezel area includes a plurality of straight-line extension areas and a corner area disposed between the plurality of straight-line extension areas, and the circuit area further includes a plurality of virtual gate driving circuit groups, each of the virtual gate driving circuit groups includes at least one virtual gate driving circuit, the plurality of virtual gate driving circuit groups are dispersed around the display area in the corner area.

In an exemplary implementation, a distance between two adjacent groups of virtual gate driving circuits is between ⅙ and ⅓ of a length of the corner area.

In an exemplary implementation, the display substrate further includes a first planarization layer disposed between the fourth conductive layer and the fifth conductive layer, and the first planarization layer above the first gate driving circuit and the first planarization layer above the second gate driving circuit are continuously arranged.

An embodiment of the present disclosure further provides a display apparatus, including the display substrate as described in any one of the above.

The embodiment of the present disclosure provides a manufacturing method for a display substrate, the display substrate includes a display area and a bezel area located on at least one side of the display area, wherein the bezel area includes a circuit area and a partition area sequentially arranged along a direction away from the display area, the circuit area includes a third gate driving circuit, a second gate driving circuit and a first gate driving circuit sequentially arranged along a direction away from the display area, the partition area includes a power supply line, the power supply line includes a first branch and a second branch. The manufacturing method includes forming a first semiconductor layer, a first conductive layer, a second conductive layer, a second semiconductor layer, a third conductive layer, a fourth conductive layer, and a fifth conductive layer in sequence on a base substrate, wherein the first semiconductor layer includes active layers of a plurality of polysilicon transistors, the first conductive layer includes gate electrodes of a plurality of polysilicon transistors and a first plate of a storage capacitor, the second conductive layer includes a second plate of the storage capacitors, the second semiconductor layer includes active layers of a plurality of oxide transistors, the third conductive layer includes gate electrodes of a plurality of oxide transistors, the fourth conductive layer includes first electrodes and second electrodes of a plurality of polysilicon transistors, first electrodes and second electrodes of a plurality of oxide transistors and the first branch of the power supply line, the fifth conductive layer includes the second branch of the power supply line; an orthographic projection of the second branch of the power supply line on the base substrate and an orthographic projection of the first branch of the power supply line on the base substrate have an overlapped area, and the orthographic projection of the second branch of the power supply line on the base substrate and an orthographic projection of the first gate driving circuit on the base substrate have an overlapped area; the orthographic projection of the first branch of the power supply line on the base substrate and the orthographic projection of the first gate driving circuit on the base substrate does not have an overlapped area.

Other aspects may be comprehended upon reading and understanding drawings and detailed descriptions.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure, but do not constitute limitations on the technical solutions of the present disclosure. Shapes and sizes of various components in the drawings do not reflect actual scales, but are only intended to schematically illustrate contents of the present disclosure.

FIG. 3b is a sectional view taken along a direction A-A in FIG. 3a.

DETAILED DESCRIPTION

Figure 1:
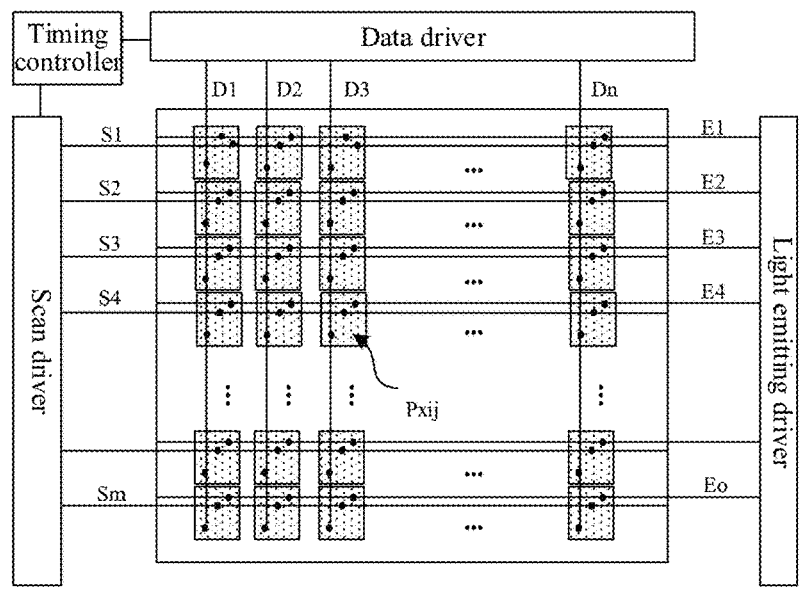
FIG. 1 is a schematic diagram of a structure of a display apparatus according to an embodiment of the present disclosure.

To make objectives, technical solutions, and advantages of the present disclosure clearer, the embodiments of the present disclosure will be described in detail with reference to the accompanying drawings. It is to be noted that implementations may be practiced in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of various constituent element, a thickness of a layer, or an area is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand specific meanings of these terms in the present disclosure according to specific situations.

In the specification, a transistor refers to a component which at least includes three terminals, i.e., a gate electrode, a drain electrode and a source electrode. The transistor has a channel area between the drain electrode (drain electrode terminal, drain area, or drain) and the source electrode (source electrode terminal, source area, or source), and a current can flow through the drain electrode, the channel area, and the source electrode. It is to be noted that, in the specification, the channel area refers to an area through which the current mainly flows.

In the specification, a first electrode may be a drain electrode, and a second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with a certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver, and a pixel array, wherein the timing controller is connected with the data driver, the scan driver, and the light emitting driver, respectively, the data driver is connected with a plurality of data signal lines (D1 to Dn) respectively, the scan driver is connected with a plurality of scan signal lines (S1 to Sm) respectively, and the light emitting driver is connected with a plurality of light emitting signal lines (E1 to Eo) respectively. The pixel array may include a plurality of sub-pixels Pxij, wherein i and j may be natural numbers. At least one sub-pixel Pxij may include a circuit unit and a light emitting device connected with the circuit unit, wherein the circuit unit may include at least one pixel driving circuit which is connected with a scan signal line, a data signal line, and a light emitting signal line, respectively. In an exemplary implementation, the timing controller may provide the data signal driver with a grayscale value and a control signal which are suitable for the specification of the data signal driver, provide the scan driver with a clock signal and a scan start signal which are suitable for the specification of the scan driver, and provide the light emitting driver with a clock signal and an emission stop signal which are suitable for the specification of the light emitting driver. The data driver may generate data voltages to be provided to the data signal lines D1, D2, D3, . . . , and Dn using the grayscale value and the control signal that are received from the timing controller. For example, the data driver may sample the gray-scale value by using the clock signal, and apply a data voltage corresponding to the gray-scale value to the data signal lines D1 to Dn by taking a pixel row as a unit, wherein n may be a natural number. The scan driver may generate a scan signals to be provided to the scan signal lines S1, S2, S3, . . . , and Sm by receiving the clock signal and the scan start signal from the timing controller. For example, the scan driver may provide a scan signal with an on-level pulse to the scan signal lines S1 to Sm sequentially. For example, the scan driver may be constructed in a form of a GOA circuit and may generate a scan signal in a manner that the scan start signal provided in a form of an on-level pulse is transmitted to a next-stage circuit sequentially under the control of the clock signal, wherein m may be a natural number. The light emitting driver may receive a clock signal, an emission stop signal, etc., from the timing controller to generate an emission signal to be provided to the light emitting signal lines E1, E2, E3, . . . , and Eo. For example, the light-emitting driver may provide a transmit signal with an off-level pulse to the light-emitting signal lines E1 to Eo sequentially. For example, the light-emitting driver may be constructed in a form of a GOA circuit, and may generate a transmit signal in a manner that the transmit stop signal provided in a form of an off-level pulse is transmitted to a next-stage circuit sequentially under the control of the clock signal, wherein o may be a natural number.

In some exemplary implementations, a shape of a sub-pixel Pxij may be a rectangle, a rhombus, a pentagon, or a hexagon. When a pixel unit includes three sub-pixels, the three sub-pixels may be arranged side by side horizontally, side by side vertically, or in a shape of a Chinese character "品". When a pixel unit includes four sub-pixels, the four sub-pixels may be arranged side by side horizontally, side by side vertically, or in a shape of a square. However, this embodiment is not limited thereto.

In some exemplary implementations, a pixel unit in the display area may include three sub-pixels, and the three sub-pixels may be a red sub-pixel, a green sub-pixel, and a blue sub-pixel respectively. However, this embodiment is not limited thereto. In some examples, a pixel unit may include four sub-pixels, wherein the four sub-pixels are respectively a red sub-pixel, a green sub-pixel, a blue sub-pixel, and a white sub-pixel.

In some exemplary implementations, a timing controller, a data driver, a scan driver and a light emitting driver may be disposed in the non-display area. The scan driver and the light emitting driver may be arranged on two opposite sides of the display area respectively, such as left and right sides of the display area. The timing controller and the data driver may be arranged on a side of the display area, such as a lower side of the display area. However, this embodiment is not limited thereto.

In some exemplary implementations, a sub-pixel Pxij includes a pixel circuit. The pixel circuit may be a 3T1C, 4T1C, 5T1C, 5T2C, 6T1C, or 7T1C structure. However, this embodiment is not limited thereto. For example, the pixel circuit may include an N-type transistor and a P-type transistor. The N-type transistor may be, for example, an oxide thin film transistor and the P-type transistor may be, for example, a Low Temperature Poly Silicon thin film transistor. An active layer of a Low Temperature Poly Silicon thin film transistor is made of Low Temperature Poly Silicon (LTPS), and an active layer of an oxide thin film transistor is made of an oxide semiconductor (Oxide). A Low-temperature Poly Silicon thin film transistor has advantages such as a high mobility rate and fast charging, while an oxide thin film transistor has an advantage such as a low leakage current. The Low Temperature Poly Silicon thin film transistor and the oxide thin film transistor are integrated on one display substrate to form a Low Temperature Polycrystalline Oxide (LTPO) display substrate, and advantages of both the Low Temperature Poly Silicon thin film transistor and the oxide thin film transistor may be utilized, which may achieve low-frequency drive, reduce power consumption, and improve display quality.

LTPO display technology combines the advantages of LTPS and IGZO, which is suitable for both high-frequency display and low-frequency display, and has increasingly become a hot technology in display panel. However, LTPO display panel usually needs three groups of GOA circuits to drive, and its left bezel and right bezel will become larger than the LTPS products with two groups of GOA. In order to improve the competitiveness of LTPO products and reduce the left and right bezels of LTPO products, it is needed to provide a bezel design suitable for LTPO display panel.

Figure 2:
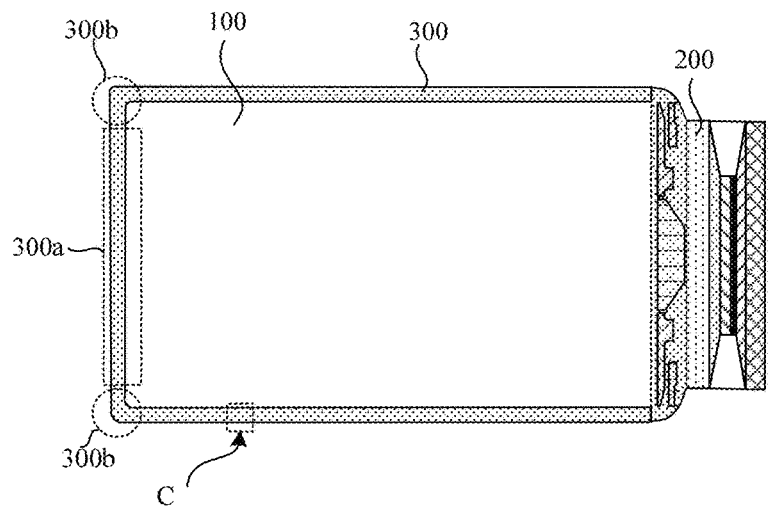
FIG. 2 is a schematic diagram of a planar structure of a display substrate according to an embodiment of the present disclosure.

FIG. 2 is a schematic diagram of a planar structure of a display substrate according to an embodiment of the present disclosure. As shown in FIG. 2, in an exemplary implementation, the display substrate may include a display area 100 and an edge area located outside the display area 100, and the edge area may include a bonding area 200 located at a side of the display area 100 and a bezel area 300 located at other sides of the display area 100. In an exemplary implementation, the display area 100 may include a plurality of sub-pixels arranged in a matrix. The bonding area 200 may at least include an isolation dam and a bonding circuit that connects signal lines of a plurality of sub-pixels to an external driving apparatus. The bezel area 300 may include at least an isolation dam, a Gate Driver on Array (GOA for short) for transmitting scan signals and light emitting signals to the circuit units of the plurality of sub-pixels, and a power supply line for transmitting voltage signals to the plurality of sub-pixels. The bonding area 200 and the isolation dam of the bezel area 300 form an annular structure surrounding the display area 100.

Figure 3A:
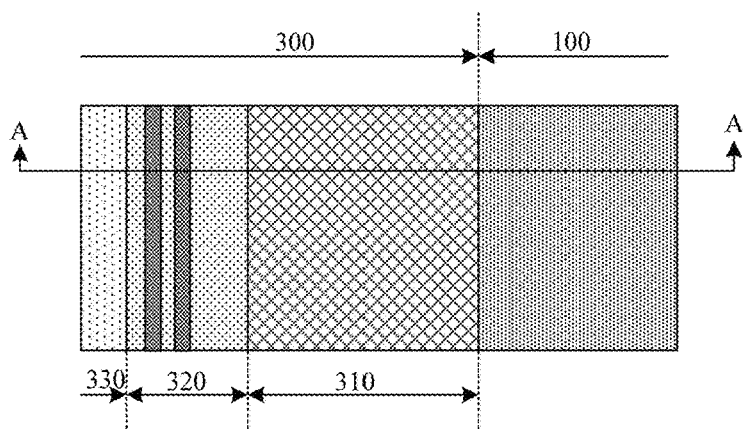
FIG. 3a is a schematic diagram of a planar structure of a bezel area according to the embodiment of the present disclosure.
Figure 3B:
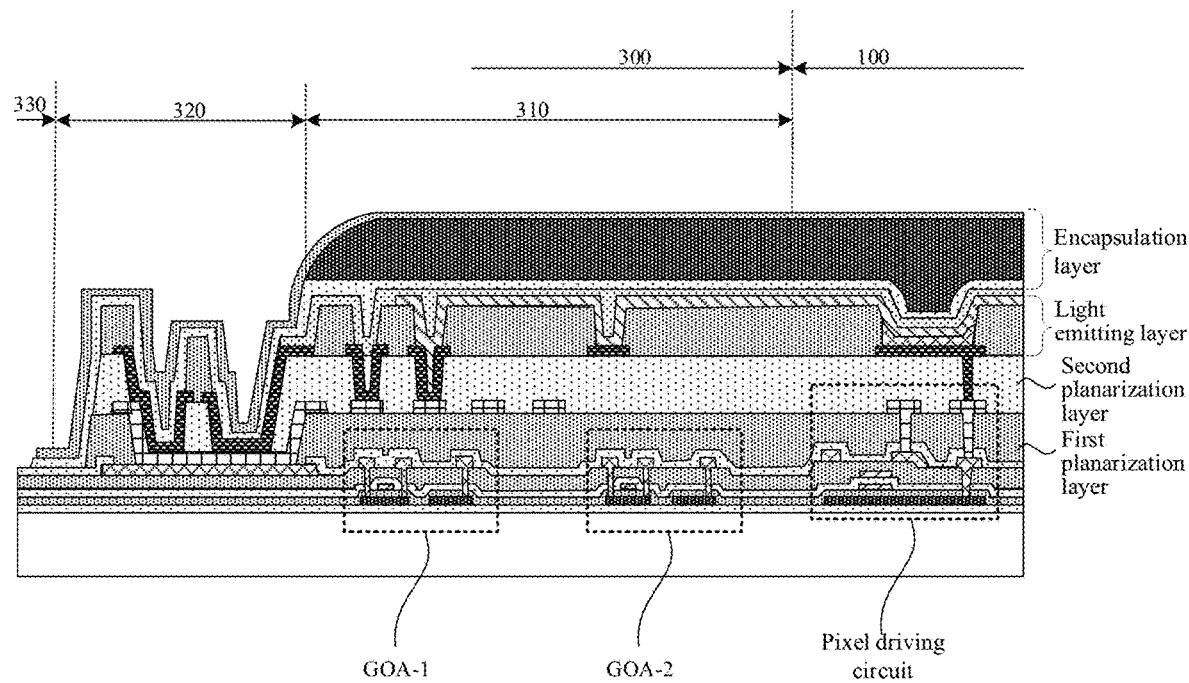
Figure 3C:
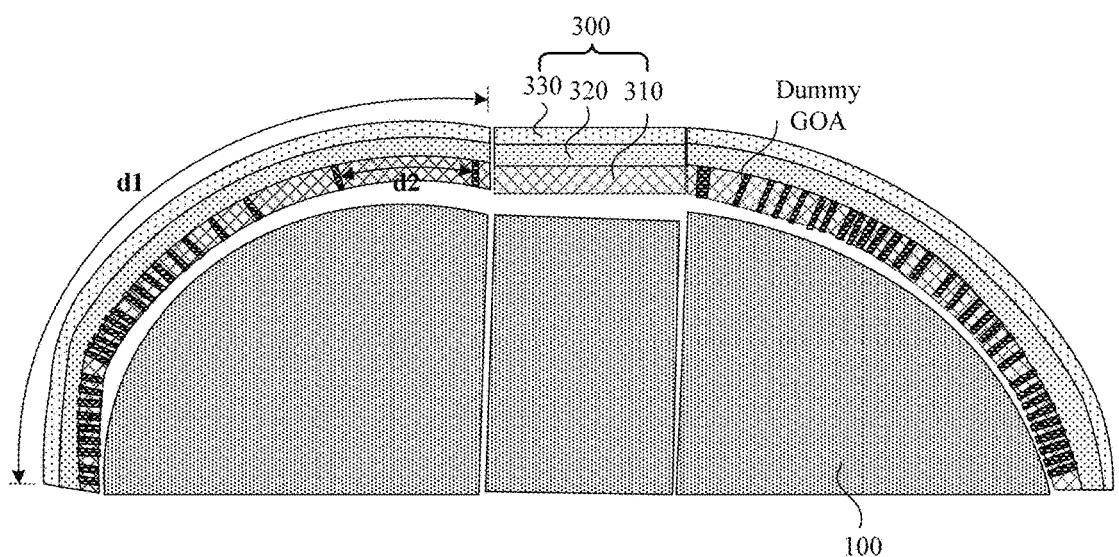
FIG. 3c is a schematic diagram of a planar structure of another bezel area according to the embodiment of the present disclosure.

FIG. 3a is a schematic diagram of a planar structure of a bezel area of a display substrate according to an embodiment of the present disclosure, which is an enlarged view of area C in FIG. 2. FIG. 3b is a sectional view of FIG. 3a along the direction A-A (wherein, the third gate driving circuit is not shown in FIG. 3b). FIG. 3c is a schematic diagram of a planar structure of another bezel area according to an embodiment of the present disclosure. As shown in FIGS. 3a, 3b, and 3c, in a plane parallel to the display substrate, the display substrate may include a display area 100 and a bezel area 300 located at least one side of the display area 100, and the bezel area 300 may include a circuit area 310, a partition area 320, and a cutting area 330 that are sequentially arranged in a direction away from the display area.

In an exemplary implementation, the display area 100 may include a plurality of circuit units and a plurality of light emitting devices, each of the circuits is provided with a pixel driving circuit, the plurality of light emitting devices is connected correspondingly to the pixel driving circuits of the plurality of circuit units, the pixel driving circuit is configured to output a current to the light emitting device connected with the pixel driving circuit, such that the light emitting device emits light with corresponding brightness.

In an exemplary implementation, the circuit area 310 may at least include a gate driving apparatus, which may be connected with pixel driving circuits of a plurality of circuit units in the display area 100 and output a scan signal and a light emitting control signal to the display area.

In an exemplary implementation, the partition area 320 may include at least a power supply line, an isolation dam, a crack dam, and the like. The power supply line may extend along a direction parallel to the edge of the display area, and connected with the second power supply line VSS of the circuit unit in the display area, the isolation dam may extend along a direction parallel to the edge of the display area. The isolation dam is configured to block an organic layer in an encapsulation layer to prevent the organic layer from flowing to the cutting area. The crack dam is configured to prevent the cutting process from affecting the film structure of the display substrate.

In an exemplary implementation, the cutting area 330 may include at least a cutting groove, the cutting groove is configured such that the cutting equipment performs cutting along the cutting groove after all the film layers are manufactured.

In an exemplary implementation, the gate driving device may include a plurality of Gate Driver On Array (GOA) circuits that are cascaded. The GOA circuits convert the clock signals into turn-on/turn-off voltages which are respectively output to the display area. Each stage of GOA circuit is usually connected with the scan signal line and light emitting signal line in one circuit unit. The row-by-row scanning to the plurality of circuit unit rows in the display area is achieved by the turn-on voltage sequentially output by each GOA circuit.

Figure 4:
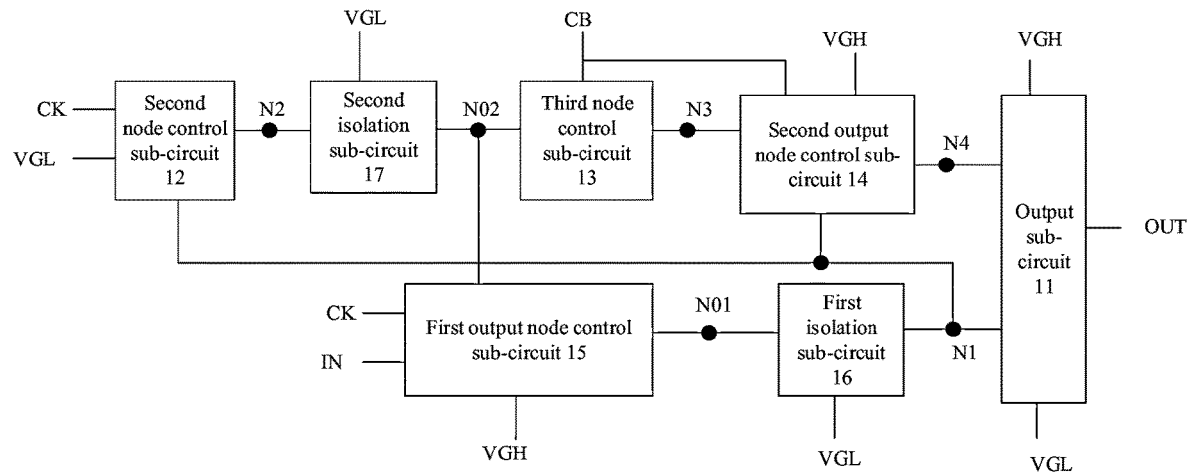
FIG. 4 is a schematic diagram of a structure of a scanning control circuit according to the embodiment of the present disclosure.

FIG. 4 is a schematic diagram of a structure of a GOA circuit according to at least one embodiment of the present disclosure. As shown in FIG. 4, the GOA circuit provided by this embodiment includes an output sub-circuit 11, a second node control sub-circuit 12, a third node control sub-circuit 13, a second output node control sub-circuit 14, a first output node control sub-circuit 15, a first isolation sub-circuit 16, and a second isolation sub-circuit 17.

The output sub-circuit 11 is electrically connected with a first output node N1, a second output node N4, a first high voltage line VGH, a second low voltage line VGL and an output terminal OUT, respectively, so as to write a low voltage signal provided by a second low voltage line VGL to the output terminal OUT under the control of the potential of the first output node N1, and write a high voltage signal provided by the first high voltage line VGH to the output terminal OUT under the control of the potential of the second output node N4.

The second node control sub-circuit 12 is electrically connected with a first clock signal line CK, the second low voltage line VGL, the first output node N1 and a second node N2, respectively, so as to write the low voltage signal provided by the second low voltage line VGL to the second node N2 under the control of the first clock signal provided by the first clock signal line CK, and write the first clock signal provided by the first clock signal line CK to the second node N2 under the control of the potential of the first output node N1.

The third node control sub-circuit 13 is electrically connected with a third node N3, a second isolation node N02 and a second clock signal line CB, respectively, so as to write the second clock signal to the third node N3 under the control of the potential of the second isolation node N02 and adjust the potential of the third node N3 according to the potential of the second isolation node N02.

The second output node control sub-circuit 14 is electrically connected with the second clock signal line CB, the third node N3, the second output node N4, the first high voltage line VGH and the first output node N1, respectively, so as to control the communication between the third node N3 and the second output node N4 under the control of the second clock signal, and write the high voltage signal provided by the first high voltage line VGH to the second output node N4 under the control of the potential of the first output node N1, and maintain the potential of the second output node N4.

The first output node control sub-circuit 15 is electrically connected with the first clock signal line CK, the input terminal IN, the second clock signal line CB, the first high voltage line VGH, the second isolation node N02 and the first isolation node N01, respectively, so as to write an input signal provided by the input terminal IN into the first isolation node N01 under the control of the first clock signal, and write a high voltage signal into the first isolation node N01 under the control of the second clock signal and the potential of the second isolation node N02.

The first isolation sub-circuit 16 is electrically connected with the second low voltage line VGL, the first output node N1, and the first isolation node N01, respectively, so as to control the communication between the first output node N1 and the first isolation node N01 under the control of the second low voltage provided by the second low voltage line VGL.

The second isolation sub-circuit 17 is electrically connected with the second low voltage line VGL, the second node N2 and the second isolation node N02, respectively, so as to control the communication between the second node N2 and the second isolation node N02 under the control of the second low voltage provided by the second low voltage line VGL.

The shift register unit provided by the present disclosure can prevent the potential of the first output node N1 from being too low to affect the potential of the first isolation node N01 and the potential of the second isolation node N02 from being too low to affect the potential of the second node N2 by adding the first isolation sub-circuit 16 and the second isolation sub-circuit 17.

When the shift register unit provided by the present disclosure is working, the second node control sub-circuit 12 writes the low voltage signal to the second node N2 under the control of the first clock signal, and writes the first clock signal to the second node N2 under the control of the potential of the first output node N1. The second isolation sub-circuit 17 controls the communication between the second node N2 and the second isolation node N02 under the control of the second low voltage. The third node control sub-circuit 13 writes the second clock signal to the third node N3 under the control of the potential of the second isolation node N02, and adjusts the potential of the third node N3 according to the potential of the second node N2. The second output node control sub-circuit 14 controls the communication between the third node N3 and the second output node N4 under the control of the second clock signal, writes the high voltage signal provided by the first high voltage line VGH to the second output node N4 under the control of the potential of the first output node N1, and maintains the potential of the second output node N4. The first output node control sub-circuit 15 writes the input signal provided by the input terminal IN to the first isolation node N01 under the control of the first clock signal, and writes the high voltage signal to the first isolation node N01 under the control of the second clock signal and the potential of the second isolation node N02. The first isolation sub-circuit 16 controls the communication between the first output node N1 and the first isolation node N01 under the control of the second low voltage.

Figure 5:
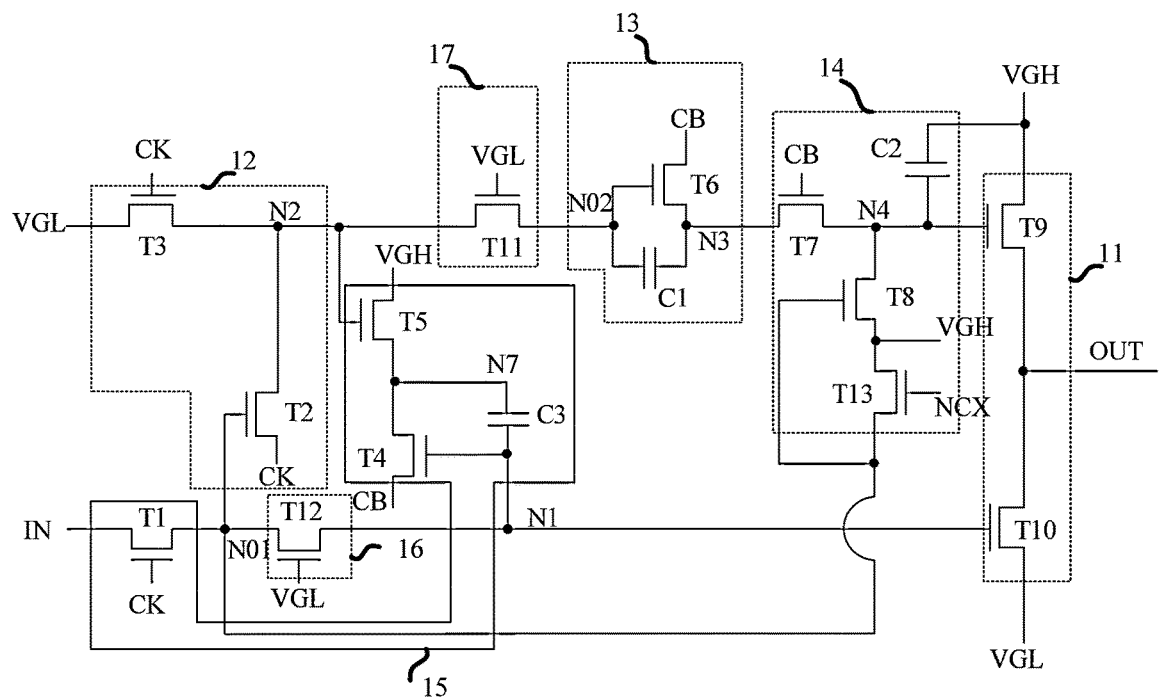
FIG. 5 is an equivalent circuit diagram of a scanning control circuit according to an embodiment of the present disclosure.

In some exemplary implementations, as shown in FIG. 5, the output sub-circuit 11 includes a ninth transistor T9 and a tenth transistor T10.

A gate electrode of the ninth transistor T9 is electrically connected with the second output node N4, a first electrode of the ninth transistor T9 is electrically connected with the first high voltage line VGH, and a second electrode of the ninth transistor T9 is electrically connected with the output terminal OUT.

A gate electrode of the tenth transistor T10 is electrically connected with the first output node N1, a first electrode of the tenth transistor T10 is electrically connected with the output terminal OUT, and a second electrode of the tenth transistor T10 is electrically connected with the second low voltage line VGL.

In some exemplary implementations, the second node control sub-circuit 12 may include a third transistor T3 and a second transistor T2.

A gate electrode of the third transistor T3 is electrically connected with the first clock signal line CK, a first electrode of the third transistor T3 is electrically connected with the second low voltage line VGL, and a second electrode of the third transistor T3 is electrically connected with the second node N2.

A gate electrode of the second transistor T2 is electrically connected with the first isolation node N01, a first electrode of the second transistor T2 is electrically connected with the first clock signal line CK, and a second electrode of the second transistor T2 is electrically connected with the second node N2.

In some exemplary implementations, as shown in FIG. 5, the third node control sub-circuit 13 includes a sixth transistor T6 and a first capacitor C1.

A gate electrode of the sixth transistor T6 is electrically connected with the second isolation node N02, a first electrode of the sixth transistor T6 is electrically connected with the second clock signal line CB, and a second electrode of the sixth transistor T6 is electrically connected with the third node N3.

A first plate of the first capacitor C1 is electrically connected with the second isolation node N02, and a second plate of the first capacitor C1 is electrically connected with the third node N3.

In some exemplary implementations, the second output node control sub-circuit 14 includes a seventh transistor T7, an eighth transistor T8, a thirteenth transistor T13 and a second capacitor C2.

A gate electrode of the seventh transistor T7 is electrically connected with the second clock signal line CB, a first electrode of the seventh transistor T7 is electrically connected with the third node N3, and a second electrode of the seventh transistor T7 is electrically connected with the second output node N4.

A gate electrode of the eighth transistor T8 is electrically connected with the first isolation node N01, a first electrode of the eighth transistor T8 is electrically connected with the first high voltage line VGH, and a second electrode of the eighth transistor T8 is electrically connected with the second output node N4.

A gate electrode of the thirteenth transistor T13 is electrically connected with a third clock signal line NCX, a first electrode of the thirteenth transistor T13 is electrically connected with the first isolation node N01, and a second electrode of the thirteenth transistor T13 is electrically connected with the first high voltage line VGH.

A first plate of the second capacitor C2 is electrically connected with the second output node N4, and a second plate of the second capacitor C2 is electrically connected with the first high voltage line VGH.

In some exemplary implementations, as shown in FIG. 5, the first output node control sub-circuit 15 includes a first transistor T1, a fourth transistor T4, a fifth transistor T5 and a third capacitor C3.

A gate electrode of the first transistor T1 is electrically connected with the first clock signal line CK, a first electrode of the first transistor T1 is electrically connected with the input terminal IN, and a second electrode of the first transistor T1 is electrically connected with the first isolation node N01.

A gate electrode of the fourth transistor T4 is electrically connected with the first output node N1, and a second electrode of the fourth transistor T4 is electrically connected with the second clock signal line CB.

A gate electrode of the fifth transistor T5 is electrically connected with the second node N2, a first electrode of the fifth transistor T5 is electrically connected with the first high voltage line VGH, and a second electrode of the fifth transistor T5 is electrically connected with the first electrode of the fourth transistor T4 (i.e., the seventh node N7).

A first plate of the third capacitor C3 is electrically connected with the first output node N1, and a second plate of the third capacitor C3 is electrically connected with the seventh node N7.

In some exemplary implementations, the first isolation sub-circuit 16 includes a twelfth transistor T12.

A gate electrode of the twelfth transistor T12 is electrically connected with the second low voltage line VGL, a first electrode of the twelfth transistor T12 is electrically connected with the first isolation node N01, and a second electrode of the twelfth transistor T12 is electrically connected with the first output node N1.

In some exemplary implementations, as shown in FIG. 5, the second isolation sub-circuit 17 includes an eleventh transistor T11.

A gate electrode of the eleventh transistor T11 is electrically connected with the second low voltage line VGL, a first electrode of the eleventh transistor T11 is electrically connected with the second node N2, and a second electrode of the eleventh transistor T11 is electrically connected with the second isolation node N02.

FIG. 5 is an equivalent circuit diagram of a GOA circuit in accordance with at least one embodiment of the present disclosure. As shown in FIG. 5, the GOA circuit provided by the exemplary embodiment includes an output sub-circuit 11, a second node control sub-circuit 12, a third node control sub-circuit 13, a second output node control sub-circuit 14, a first output node control sub-circuit 15, a first isolation sub-circuit 16, and a second isolation sub-circuit 17. The output sub-circuit 11 includes a ninth transistor T9 and a tenth transistor T10, the second node control sub-circuit 12 may include a third transistor T3 and a second transistor T2, the third node control sub-circuit 13 includes a sixth transistor T6 and a first capacitor C1, the second output node control sub-circuit 14 includes a seventh transistor T7, an eighth transistor T8, a thirteenth transistor T13 and a second capacitor C2, the first output node control sub-circuit 15 includes a first transistor T1, a fourth transistor T4, a fifth transistor T5 and a third capacitor C3, the first isolation sub-circuit 16 includes a twelfth transistor T12, and the second isolation sub-circuit 17 includes an eleventh transistor T11.

A gate electrode of the ninth transistor T9 is electrically connected with the second output node N4, a first electrode of the ninth transistor T9 is electrically connected with the first high voltage line VGH, and a second electrode of the ninth transistor T9 is electrically connected with the output terminal OUT. A gate electrode of the tenth transistor T10 is electrically connected with the first output node N1, a first electrode of the tenth transistor T10 is electrically connected with the output terminal OUT, and a second electrode of the tenth transistor T10 is electrically connected with the second low voltage line VGL. A gate electrode of the second transistor T2 is electrically connected with the first isolation node N01, a first electrode of the second transistor T2 is electrically connected with the first clock signal line CK, and a second electrode of the second transistor T2 is electrically connected with the second node N2. A gate electrode of the third transistor T3 is electrically connected with the first clock signal line CK, a first electrode of the third transistor T3 is electrically connected with the second low voltage line VGL, and a second electrode of the third transistor T3 is electrically connected with the second node N2. A gate electrode of the sixth transistor T6 is electrically connected with the second isolation node N02, a first electrode of the sixth transistor T6 is electrically connected with the second clock signal line CB, and a second electrode of the sixth transistor T6 is electrically connected with the third node N3. A first plate of the first capacitor C1 is electrically connected with the second isolation node N02, and a second plate of the first capacitor C1 is electrically connected with the third node N3. A gate electrode of the seventh transistor T7 is electrically connected with the second clock signal line CB, a first electrode of the seventh transistor T7 is electrically connected with the third node N3, and a second electrode of the seventh transistor T7 is electrically connected with the second output node N4. A gate electrode of the eighth transistor T8 is electrically connected with the first isolation node N01, a first electrode of the eighth transistor T8 is electrically connected with the first high voltage line VGH, and a second electrode of the eighth transistor T8 is electrically connected with the second output node N4. A gate electrode of the thirteenth transistor T13 is electrically connected with a third clock signal line NCX, a first electrode of the thirteenth transistor T13 is electrically connected with the first isolation node N01, and a second electrode of the thirteenth transistor T13 is electrically connected with the first high voltage line VGH. A first plate of the second capacitor C2 is electrically connected with the second output node N4, and a second plate of the second capacitor C2 is electrically connected with the first high voltage line VGH. A gate electrode of the first transistor T1 is electrically connected with the first clock signal line CK, a first electrode of the first transistor T1 is electrically connected with the input terminal IN, and a second electrode of the first transistor T1 is electrically connected with the first isolation node N01. A gate electrode of the fourth transistor T4 is electrically connected with the first output node N1, and a second electrode of the fourth transistor T4 is electrically connected with the second clock signal line CB. A gate electrode of the fifth transistor T5 is electrically connected with the second node N2, a first electrode of the fifth transistor T5 is electrically connected with the first high voltage line VGH, and a second electrode of the fifth transistor T5 is electrically connected with the first electrode of the fourth transistor T4 (i.e., the seventh node N7). A first plate of the third capacitor C3 is electrically connected with the first output node N1, and a second plate of the third capacitor C3 is electrically connected with the seventh node N7. A gate electrode of the twelfth transistor T12 is electrically connected with the second low voltage line VGL, a first electrode of the twelfth transistor T12 is electrically connected with the first isolation node N01, and a second electrode of the twelfth transistor T12 is electrically connected with the first output node N1. A gate electrode of the eleventh transistor T11 is electrically connected with the second low voltage line VGL, a first electrode of the eleventh transistor T11 is electrically connected with the second node N2, and a second electrode of the eleventh transistor T11 is electrically connected with the second isolation node N02.

In the present exemplary implementation, the first output node N1, the second node N2, the third node N3, the second output node N4, the first isolation node N01, the second isolation node N02, and the seventh node N7 are meeting points representing related electrical connections in the circuit diagram. In other words, these nodes are nodes equivalent to the convergence points of related electrical connections in the circuit diagram.

In some exemplary implementations, the first transistor T1 to the thirteenth transistor T13 in the GOA circuit may all be P-type thin film transistors, such as LTPS (Low Temperature Poly-silicon) thin film transistors. In addition, a thin film transistor with a bottom gate structure or a thin film transistor with a top gate structure may be selected in the embodiment of the present disclosure as long as a switch function may be achieved. This embodiment is not limited thereto.

Figure 6:
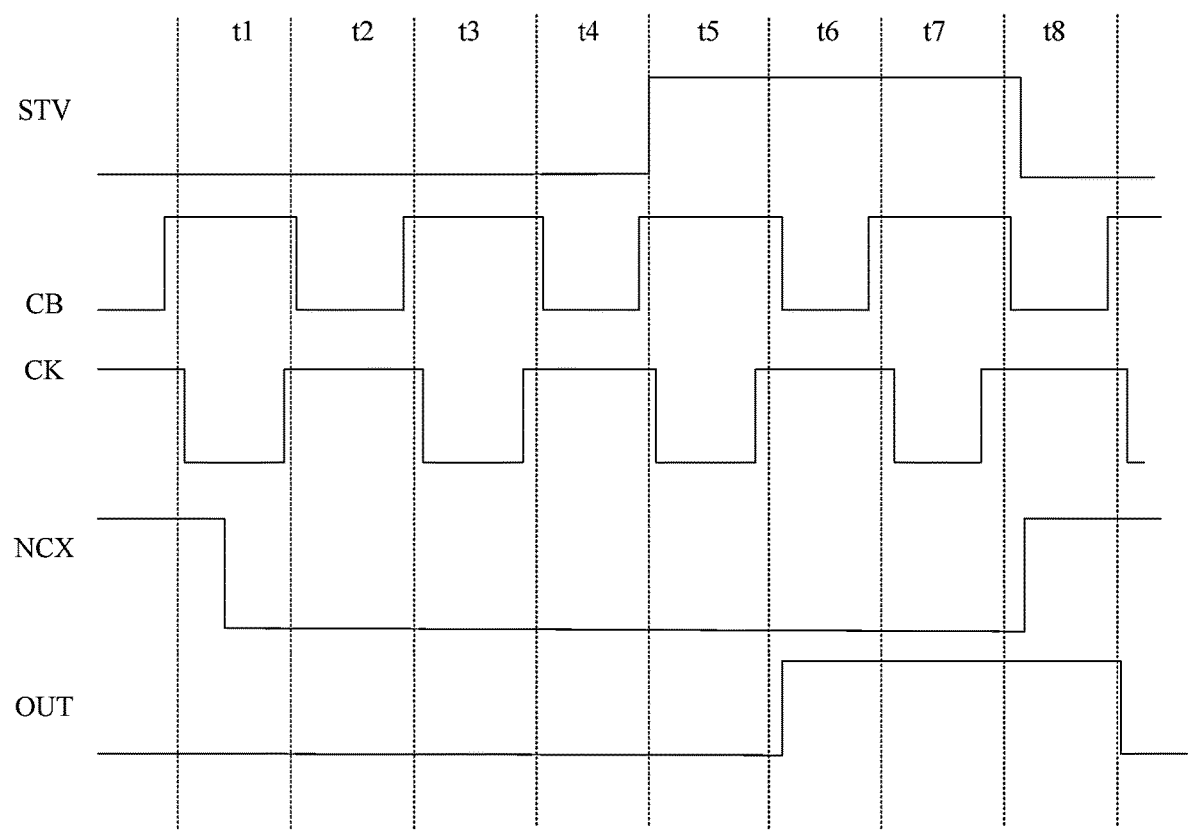
FIG. 6 is a schematic diagram of a driving timing of the scanning control circuit shown in FIG. 5.

The technical scheme of this embodiment is further explained by the working process of GOA circuit. The following illustration is made by taking the working process of a GOA circuit of first stage as an example, wherein the input terminal IN of the GOA circuit of first stage is connected with the initial signal line STV. FIG. 6 is a working timing diagram of the GOA circuit shown in FIG. 5. As shown in FIGS. 5 and 6, the GOA circuit of the present exemplary embodiment includes 13 transistor units (e.g. first transistor T1 to thirteenth transistor T13), 3 capacitor units (i.e. first capacitor C1 to third capacitor C3), 4 input terminals (i.e. input terminal IN, first clock signal line CK, second clock signal line CB and third clock signal line NCX), 1 output terminal (i.e. output terminal OUT), and 2 power supply terminals (i.e. first high voltage line VGH and second low voltage line VGL). In some examples, the first high voltage line VGH continuously provides a high level signal, the second low voltage line VGL continuously supplies a low level signal.

The working process of the GOA circuit will be explained by taking the example that the GOA circuit of the present embodiment supplies a scan signal or a reset signal to the N-type transistor of the pixel circuit. The working process of the GOA circuit provided by the present exemplary embodiment includes a plurality of stages below.

The working process of the shift register unit provided by the present disclosure includes:

a first stage T1, wherein the input terminal IN provides low voltage, the second clock signal line CB provides high voltage, the first clock signal line CK provides low voltage, the third clock signal line NCX provides high voltage, both T1 and T3 are turned on, the low voltage provided by the input terminal IN is written into the first isolation node N01, and T2 is turned on, the second node N2 is written with a low voltage and T8 is turned on, the second output node N4 is written with a high voltage and T9 is turned off, T10 is turned on, and the output terminal OUT outputs low voltage;

a second stage T2, wherein the input terminal IN provides low voltage, the second clock signal line CB provides low voltage, the first clock signal line CK provides high voltage, the third clock signal line NCX provides low voltage, T1 is turned off, T3 is turned off, the first isolation node N01 maintains low voltage, T2 is turned on, the potential of the second node N2 becomes high voltage, T8 and T13 are turned on, the second output node N4 is written with high voltage, T9 is turned off, T10 is turned on, and the output terminal OUT outputs low voltage;

a third stage T3, wherein the input terminal IN provides low voltage, the second clock signal line CB provides high voltage, the first clock signal line CK provides low voltage, the third clock signal line NCX provides low voltage, T1 and T3 are turned on, the low voltage provided by the input terminal IN is written into N01 and T2 is turned on, the second node N2 is written with low voltage, T8 and T13 are turned on, the second output node N4 is written with high voltage, T9 is turned off, T10 is turned on, and the output terminal OUT outputs low voltage;

a fourth stage t4, wherein the input terminal IN provides low voltage, the second clock signal line CB provides low voltage, the first clock signal line CK provides high voltage, the third clock signal line NCX provides low voltage, T1 is turned off, T3 is turned off, the first isolation node N01 maintains low voltage, T2 is turned on, the potential of the second node N2 becomes high voltage, T8 and T13 are turned on, N4 is written with high voltage, T9 is turned off, T10 is turned on, and the output terminal OUT outputs low voltage;

a fifth stage t5, wherein the input terminal IN provides high voltage, the second clock signal line CB provides high voltage, the first clock signal line CK provides low voltage, the third clock signal line NCX provides low voltage, T1 is turned on, the high voltage provided by the input terminal IN is written into N1, T3 is turned on, the VGL is written into N2, T6 is turned on, the potential of the third node N3 is high voltage, T4 is turned off, T7 is turned off, T8 is turned off, T9 is turned off, T10 is turned off, and the potential of the light emitting control signal output by the output terminal OUT is maintained at low voltage;

a sixth stage t6, wherein the input terminal IN provides high voltage, the second clock signal line CB provides low voltage, the first clock signal line CK provides high voltage, the third clock signal line NCX provides low voltage, T1 is turned off, T3 is turned off, T2 is turned off, the potential of the second node N2 is maintained at low voltage, T6 is turned on, T7 is turned on, the potential of N4 is low voltage, T4 and T5 are turned on, the potential of the first output node N1 is high voltage, T9 is turned on, T10 is turned off, and the output terminal OUT outputs the first high voltage provided by the first high voltage line VGH;

a seventh stage t7, wherein the input terminal IN provides high voltage, the second clock signal line CB provides high voltage, the first clock signal line CK provides low voltage, the third clock signal line NCX provides low voltage, T1, T3 and T13 are all turned on, the potential of the first output node N1 is high voltage, the potential of N2 is low voltage, T6 is turned on, T5 is turned on, T4 is turned off, the potential of the third node N3 is high voltage, T7 is turned off, T8 is turned off, the potential of the second output node N4 is maintained at low voltage, T9 is turned on, T10 is turned off, and the output terminal OUT outputs the first high voltage provided by the first high voltage line VGH;

an eighth stage t8, wherein the input terminal IN provides low voltage, the second clock signal line CB provides low voltage, the first clock signal line CK provides high voltage, the third clock signal line NCX provides high voltage, T1, T3 and T13 are all turned off, the potential of the first output node N1 is maintained at high voltage, T2 is turned off, the potential of N2 is maintained at low voltage, T6 is turned on, T7 is turned on, the potential of the second output node N4 is low voltage, T9 is turned on, T10 is turned off, and the output terminal OUT outputs the first high voltage provided by the first high voltage line VGH;

After the eighth stage t8, the input terminal IN provides a low voltage, the working state of the circuit can refer to the first stage t1 to the fourth stage t4, and the output terminal OUT outputs a low voltage until the input terminal IN inputs a high-level signal, and then starts again from the fifth stage t5.

In some exemplary implementations, the output signal of the GOA circuit provided by the present embodiment may be provided as a gate driving signal (e.g., a scan signal or a reset signal, or a light emitting control signal) to a pixel driving circuit of the display area. In some examples, the GOA circuit of the present embodiment may be applied to a low-temperature polycrystalline oxide display substrate and may provide a gate driving signal to an N-type transistor in a pixel circuit of a display area. However, this embodiment is not limited thereto.

In some exemplary implementations, the first clock signal input by the first clock signal terminal CK and the second clock signal input by the second clock signal terminal CB are both pulse signals, and the pulse widths of the first clock signal and the second clock signal may be substantially the same. The duty cycles of the first clock signal and the second clock signal may be greater than ½, e.g. may be about ⅓. In this embodiment, the duty cycle refers to the proportion of the high-level duration in the whole pulse period within one pulse period (including the high-level duration and the low-level duration).

In some exemplary implementations, the second low voltage line VGL may continuously provide a low level signal, and the first high voltage line VGH may continuously provide a high level signal. However, this embodiment is not limited thereto.

Embodiments of the present disclosure provide a display substrate including a display area and a bezel area located on at least one side of the display area. As shown in conjunction with FIGS. 3, 7, 8, 9a to 14b, the bezel area includes a circuit area 310 and a partition area 320 sequentially arranged in a direction away from the display area, the circuit area 310 includes a third gate driving circuit (not shown in the figure), a second gate driving circuit GOA2 and a first gate driving circuit GOA1 sequentially arranged in a direction away from the display area, and the partition area includes a power supply line VSS and an isolation dam disposed on the power supply line VSS, the power supply line VSS includes a first branch VSS-1 and a second branch VSS-2.

In a plane perpendicular to the display substrate, the display substrate includes a first semiconductor layer, a first conductive layer, a second conductive layer, a second semiconductor layer, a third conductive layer, a fourth conductive layer, and a fifth conductive layer that are sequentially arranged on a base substrate; the first semiconductor layer includes active layers of a plurality of poly-silicon transistors, the first conductive layer includes gate electrodes of the plurality of poly-silicon transistors and a first plate of a storage capacitor, the second conductive layer includes a second plate of the storage capacitor, the second semiconductor layer includes active layers of a plurality of oxide transistors, the third conductive layer includes gate electrodes of the plurality of oxide transistors, the fourth conductive layer includes first electrodes and second electrodes of the plurality of poly-silicon transistors, and first electrodes and second electrodes of the plurality of oxide transistors and the first branch VSS-1 of the power supply line, and the fifth conductive layer includes the second branch VSS-2 of the power supply line.

An orthographic projection of the second branch VSS-2 of the power supply line on the base substrate has an overlapped area with an orthographic projection of the first branch VSS-1 of the power supply line on the base substrate (thereby forming a double-layer trace), and the orthographic projection of the second branch VSS-2 of the power supply line on the base substrate has an overlapped area with an orthographic projection of the first gate driving circuit GOA-1 on the base substrate.

In the original LTPO GOA bezel design, the power supply line VSS is only located in the partition area 320, the size of its bezel is about 1.2 mm, and the lateral space of its unilateral GOA circuit is 626 um. In the display substrate according to an embodiment of the present disclosure, by extending the power supply line VSS from the partition area 320 to the circuit area 310, a part of the second branch VSS-2 of the power supply line is overlapped with the first gate driving circuit GOA-1, thereby reducing the width of the bezel area and realizing a narrow bezel design. For example, in a display substrate manufactured according to the embodiment of the present disclosure, a lateral space required by a unilateral GOA circuit thereof is only 481 um, and a size required by a bezel thereof is reduced from the original 1.2 mm to 0.985 mm, which greatly reduces the left and right bezels of the display panel.

In some exemplary implementations, there is no overlapped area between the orthographic projection of the first branch VSS-1 of the power supply line on the base substrate and the orthographic projection of the first gate driving circuit GOA-1 on the base substrate.

In some exemplary implementations, there is no overlapped area between the orthographic projection of the second branch VSS-2 of the power supply line on the base substrate and the orthographic projection of the second gate driving circuit GOA-2 on the base substrate.

In some exemplary implementations, the second branch VSS-2 of the power supply line includes a plurality of exhaust openings VSS-K arranged at intervals, and an orthographic projection of the plurality of exhaust openings VSS-K on the base substrate is overlapped with the orthographic projections of the first branch VSS-1 of the power supply line and the first gate driving circuit GOA-1 on the base substrate.

In the embodiment of the present disclosure, the gas components in the first planarization layer is prevented from damaging the organic light emitting layer in the pixel by designing a plurality of exhaust openings for forming an exhaust path through which the gas components in the first planarization layer can be evaporated during the process.

In some exemplary implementations, the area of the orthographic projection of the exhaust openings VSS-K on the base substrate is 5% to 15% of the area of the orthographic projection (including a hollowed-out portion and a non-hollowed-out portion) of the second branch VSS-2 of the power supply line on the base substrate. For example, the area of the orthographic projection of the exhaust openings VSS-K on the base substrate is 10% of the area of the orthographic projection of the second branch VSS-2 of the power supply line on the base substrate.

In some exemplary implementations, a width d1 of the exhaust opening VSS-K along a first direction X is 5% to 15% of a width d3 of the partition area 320 in the first direction X, and a width d2 of the exhaust opening VSS-K along a second direction Y is 5% to 15% of the width d3 of the partition area 320 in the first direction X.

For example, the width d3 of the partition area 320 in the first direction X may be 121 um, the width d1 of the exhaust opening VSS-K in the first direction X may be 15 um, and the width d2 of the exhaust opening VSS-K in the second direction Y may be 15 um.

In some exemplary implementations, the shape of the exhaust opening VSS-K may be any shape, such as a rectangle, a triangle, a trapezoid, a pentagon, or a hexagon.

In some exemplary implementations, the first gate driving circuit GOA-1 and the second gate driving circuit GOA-2 may respectively include a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, a twelfth transistor T12, a thirteenth transistor T13, a first capacitor C1, a second capacitor C2, and a third capacitor C3.

A gate electrode of the first transistor T1, a first electrode of the second transistor T2 and a gate electrode of the third transistor T3 are all electrically connected with a first clock signal line CK, a first electrode of the first transistor T1 is electrically connected with an input terminal, and a second electrode of the first transistor T1 is electrically connected with a gate electrode of the second transistor T2, a gate electrode of the eighth transistor T8, a first electrode of the twelfth transistor T12 and a first electrode of the thirteenth transistor T13.

A second electrode of the second transistor T2 is electrically connected with a second electrode of the third transistor T3, a gate electrode of the fifth transistor T5, and a first electrode of the eleventh transistor T11.

A first electrode of the third transistor T3, a first electrode of the tenth transistor T10, a gate electrode of the eleventh transistor T11, and a gate electrode of the twelfth transistor T12 are all electrically connected with a second low voltage line VGL.

A gate electrode of the fourth transistor T4 is electrically connected with a second electrode of the twelfth transistor T12, a gate electrode of the tenth transistor T10 and a first plate of the third capacitor C3. And a second electrode of the fourth transistor T4, a first electrode of the sixth transistor T6 and a gate electrode of the seventh transistor T7 are all electrically connected with a second clock signal line CB.

A first electrode of the fifth transistor T5, a first electrode of the eighth transistor T8, a first electrode of the ninth transistor T9, a second electrode of the thirteenth transistor T13, and a second plate of the second capacitor C2 are all electrically connected with a first high voltage line VGH, and a second electrode of the fifth transistor T5 is electrically connected with a first electrode of the fourth transistor T4 and a second plate of the third capacitor C3.

A gate electrode of the sixth transistor T6 is electrically connected with a first electrode plate of the first capacitor C1 and a second electrode of the eleventh transistor T11, and a second electrode of the sixth transistor T6 is electrically connected with a second electrode plate of the first capacitor C1 and a first electrode of the seventh transistor T7.

A second electrode of the seventh transistor T7 is electrically connected with a second electrode of the eighth transistor T8, a gate electrode of the ninth transistor T9, and a first plate of the second capacitor C2; a second electrode of the ninth transistor T9 and a second electrode of the tenth transistor T10 are electrically connected with an output terminal; a gate electrode of the thirteenth transistor T13 is electrically connected with a third clock signal line NCK.

In some exemplary implementations, the first high voltage line VGH includes a first branch VGH1 and a second branch VGH2, and the second low voltage line VGL includes a first branch VGL1, a second branch VGL2, a third branch VGL3 and a fourth branch VGL4.

The first branch VGH1 of the first high voltage line, the first branch VGL1 of the second low voltage line and the second branch VGL2 of the second low voltage line are arranged in the same layer as the fourth conductive layer; the second branch VGH2 of the first high voltage line, the third branch VGL3 of the second low voltage line, and a fourth branch VGL4 of the second low voltage line are arranged in the same layer as the fifth conductive layer.

In some exemplary implementations, the first conductive layer includes a first connection electrode 101, and the fourth conductive layer includes a third connection electrode 401, a fourth connection electrode 402, and a fifth connection electrode 403.

The first connection electrode 101 is connected with the gate electrode of the second transistor T2 and the gate electrode of the eighth transistor T8 to form an integrated structure; the third connection electrode 401 and the first electrode of the thirteenth transistor T13 are connected with each other to form an integrated structure, the fourth connection electrode 402 and the second electrode of the first transistor T1 are connected with each other to form an integrated structure, and the fifth connection electrode 403 and the first electrode of the twelfth transistor T12 are connected with each other to form an integrated structure.

The first connection electrode 101 is connected with the third connection electrode 401, the fourth connection electrode 402 and the fifth connection electrode 403 through a via, respectively.

In some exemplary implementations, in the first gate driving circuit GOA-1, the shape of the third connection electrode 401 is L-shaped.

In some exemplary implementations, a third clock signal line NCK is arranged in the same layer as the fourth conductive layer, and the third clock signal line NCK includes a first protrusion NCK-1 connected with the gate electrode of the thirteenth transistor T13 through a via.

In some exemplary implementations, an active layer of the thirteenth transistor T13 includes a channel area, and in the first gate driving circuit GOA-1, a via through which the first protrusion NCK-1 is connected with the gate electrode of the thirteenth transistor T13 and a via through which the first connection electrode 101 is connected with the third connection electrode 401 are respectively located on both sides of the channel area of the thirteenth transistor T13.

In the display substrate according to an embodiment of the present disclosure, by designing the layout of the GOA circuit, the width of the GOA circuit along the first direction X is reduced, thereby reducing the bezel size.

In some exemplary implementations, in the second gate driving circuit GOA-2, the shape of the third connection electrode 401 is in a shape of "1".

In some exemplary implementations, the active layer of the thirteenth transistor T13 includes a channel area, and in the second gate driving circuit GOA-2, a via through which the first protrusion NCK-1 is connected with the gate electrode of the thirteenth transistor T13 and a via through which the first connection electrode 101 is connected with the third connection electrode 401 are located on the same side of the channel area of the thirteenth transistor T13.

In some exemplary implementations, the ninth transistor T9 includes a plurality of gate electrodes G9 arranged in parallel and at intervals, the tenth transistor T10 includes a plurality of gate electrodes G10 arranged in parallel and at intervals, the quantity of gate electrodes G9 of the ninth transistor T9 in the second gate driving circuit GOA-2 is greater than the quantity of gate electrodes G9 of the ninth transistor T9 in the first gate driving circuit GOA-1; the quantity of gate electrodes G10 of the tenth transistor T10 in the second gate driving circuit GOA-2 is smaller than the quantity of gate electrodes G10 of the tenth transistor T10 in the first gate driving circuit GOA-1.

In some exemplary implementations, in the second gate driving circuit GOA-2, the quantity of gate electrodes G9 of the ninth transistor T9 is 6, and the quantity of gate electrodes G10 of the tenth transistor T10 is 2.

In some exemplary implementations, in the first gate driving circuit GOA-1, the quantity of gate electrodes G9 of the ninth transistor T9 is 4, and the quantity of gate electrodes G10 of the tenth transistor T10 is 4.

In some exemplary implementations, in the second gate driving circuit GOA-2, a length of each gate electrode G9 of the ninth transistor T9 along the first direction X is between 30% and 40% of a width of the second gate driving circuit GOA-2 along the first direction X, and a width of each gate electrode G9 of the ninth transistor T9 along the second direction Y is between 2% and 3% of the width of the second gate driving circuit GOA-2 along the first direction X.

In some exemplary implementations, in the second gate driving circuit GOA-2, a length of each gate electrode G10 of the tenth transistor T10 along the first direction X is between 30% and 40% of a width of the second gate driving circuit GOA-2 along the first direction X, and a width of each gate electrode G10 of the tenth transistor T10 along the second direction Y is between 2% and 3% of the width of the second gate driving circuit GOA-2 in the first direction X.

The display substrate according to an embodiment of the present disclosure reduces the size of a GOA circuit on the premise of satisfying driving and operation.

In some exemplary implementations, in the second gate driving circuit GOA-2, the length of each gate electrode G9 of the ninth transistor T9 along the first direction X may be between 16 microns and 160 microns, for example, 45.4 microns; the width of each gate electrode G9 of the ninth transistor T9 along the second direction Y may be between 3 microns and 5 microns and, for example, 3.3 microns.

In some exemplary implementations, in the second gate driving circuit GOA-2, the length of each gate electrode G10 of the tenth transistor T10 along the first direction X may be between 16 microns and 160 microns, for example, 45.2 microns; the width of each gate electrode G10 of the tenth transistor T10 along the second direction Y may be between 3 microns and 5 microns, for example, 3.3 microns.

In some exemplary implementations, as shown in FIG. 3b, the display substrate further includes a first planarization layer disposed between the fourth conductive layer and the fifth conductive layer, and the first planarization layer above the first gate driving circuit GOA-1 and the first planarization layer above the second gate driving circuit GOA-2 are continuously disposed.

In some exemplary implementations, as shown in FIG. 3c, the bezel area 300 includes a plurality of straight-line extension areas 300a and a corner area 300b disposed between the plurality of straight-line extension areas 300a, and the circuit area further includes a plurality of Dummy GOA circuit groups, each of the Dummy GOA circuit group includes at least one Dummy GOA circuit, and the plurality of Dummy GOA circuit groups are dispersed around the display area 100 in the corner area 300b. In the display substrate according to an embodiment of the present disclosure, the Dummy GOA circuit is changed from the original gathering design to the regular dispersing design, thereby improving the uniformity of the GOA circuit.

In some exemplary implementations, a distance d2 between two adjacent Dummy GOA circuit groups is between ⅙ and ⅓ of the corner area length d1. For example, the distance d2 between two adjacent Dummy GOA circuit groups is up to ¼ of the length d1 of the corner area.

In some exemplary implementations, the shape of the corner area 300b may be arcuate.

A rest of the structure of the GOA circuit according to the present embodiment may be referred to descriptions of the aforementioned embodiments, and thus will not be repeated here.

The structure of the display substrate will be described below through an example of a manufacturing process of the display substrate. A "patterning process" mentioned in the present disclosure includes processes, such as deposition of a film layer, photoresist coating, mask exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a layer of a thin film prepared from a material on a base substrate using a process of deposition or coating. If a patterning process is not needed for the "thin film" during a whole manufacturing process, the "thin film" may be referred to as a "layer". When a patterning process is needed for the "thin film" during the whole manufacturing process, the thin film is referred to as a "thin film" before the patterning process and referred to as a "layer" after the patterning process. The "layer" after the patterning process includes at least one "pattern".

"A and B are arranged in the same layer" mentioned in the present disclosure refers to that A and B are simultaneously formed by the same patterning process. The "thickness" of the thin film layer is a size of the film layer in a direction perpendicular to the display substrate. In the exemplary embodiment of the present disclosure, "a projection of A includes a projection of B" refers to that a boundary of a projection of B falls within a range of a boundary of a projection of A or the boundary of a projection of A is overlapped with the boundary of a projection of B.

The manufacturing process of the display substrate according to the exemplary embodiment may include following acts.

(1) Providing a base substrate.

In some exemplary implementations, the base substrate may be a rigid substrate or a flexible substrate. The rigid substrate may include one or more of glass and metal foil sheet. The flexible substrate may include one or more of polyethylene terephthalate, ethylene terephthalate, polyether ether ketone, polystyrene, polycarbonate, polyarylate, polyarylester, polyimide, polyvinyl chloride, polyethylene, and textile fiber.

Figure 9A:
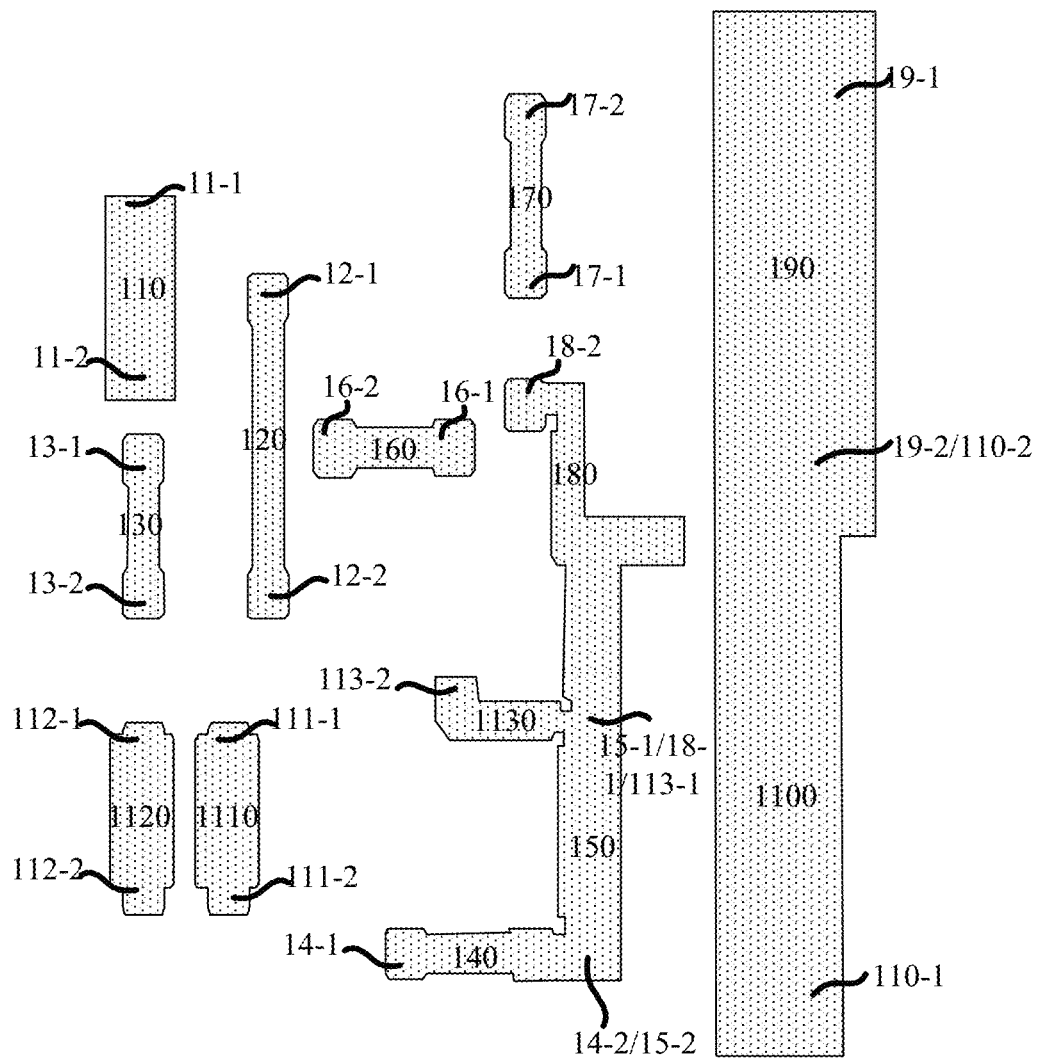
FIG. 9a is a schematic planar view of the display substrate shown in FIG. 7 after the first semiconductor layer is formed.
Figure 9B:
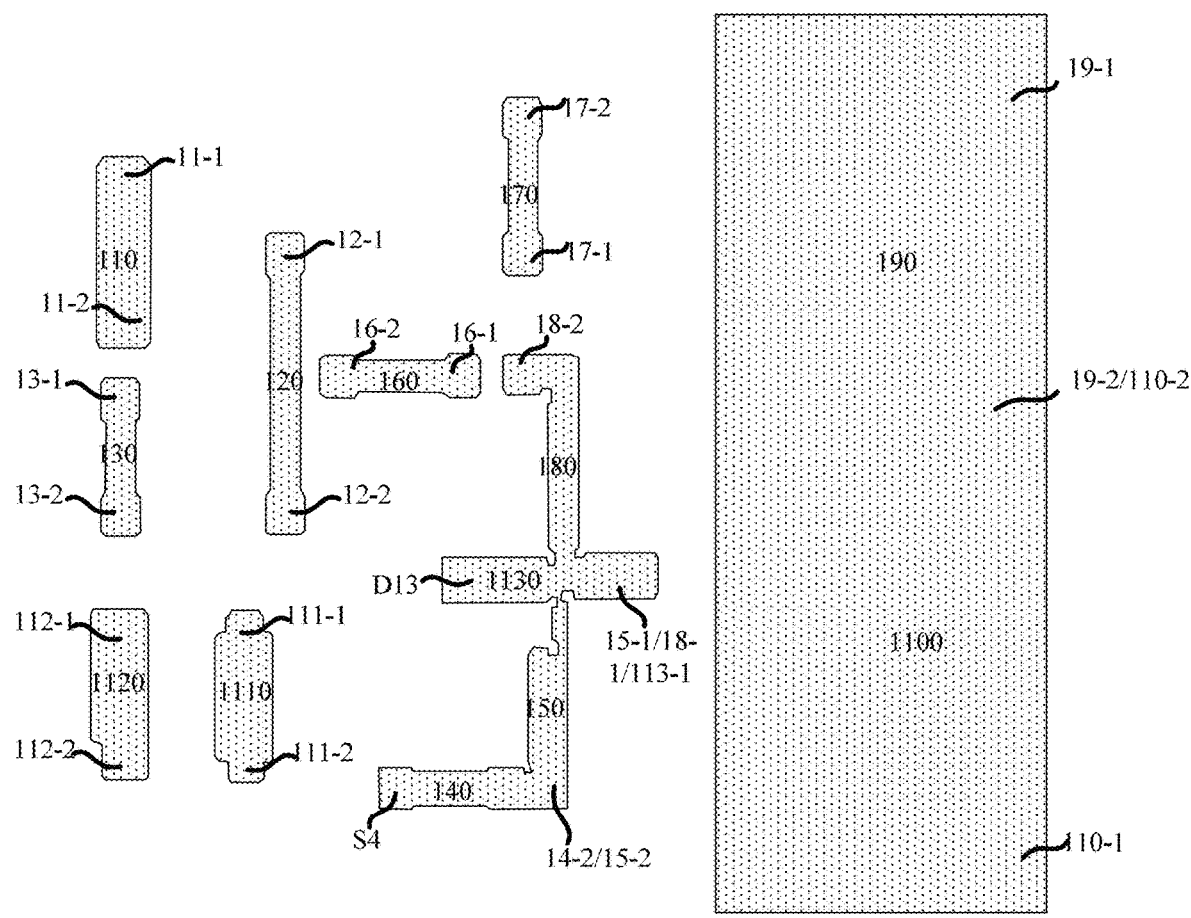
FIG. 9b is a schematic planar view of the display substrate shown in FIG. 8 after the first semiconductor layer is formed.

(2) Forming a pattern of a first semiconductor layer. In some exemplary implementations, forming a pattern of a first semiconductor layer includes: depositing a first semiconductor thin film on the base substrate, patterning the first semiconductor thin film through a patterning process, and forming a pattern of the first semiconductor layer, as shown in FIG. 9a or FIG. 9b. The pattern of the first semiconductor layer at least includes active layers of a plurality of transistors (for example, transistors T1 to T13) in the GOA circuit. An active layer may include at least one channel area and a plurality of doped regions. The channel area may not be doped with an impurity, and has characteristics of a semiconductor. A doped area is doped with an impurity and therefore has conductivity. An impurity may be changed according to a type (e.g., an N type or a P type) of a transistor. In some examples, a material of the first semiconductor thin film may be poly-silicon.

In some exemplary implementations, the first semiconductor layer at least includes: an active layer 110 of the first transistor T1, an active layer 120 of the second transistor T2, an active layer 130 of the third transistor T3, an active layer 140 of the fourth transistor T4, an active layer 150 of the fifth transistor T5, an active layer 160 of the sixth transistor T6, an active layer 170 of the seventh transistor T7, an active layer 180 of the eighth transistor T8, an active layer 190 of the ninth transistor T9, an active layer 1100 of the tenth transistor T10, an active layer 1110 of the eleventh transistor T11, an active layer 1120 of the twelfth transistor T12, an active layer 1130 of the thirteenth transistor T13.

In some exemplary implementations, the active layer 110 of the first transistor T1, the active layer 120 of the second transistor T2, the active layer 130 of the third transistor T3, the active layer 150 of the fifth transistor T5, the active layer 170 of the seventh transistor T7, the active layer 180 of the eighth transistor T8, the active layer 190 of the ninth transistor T9, the active layer 1100 of the tenth transistor T10, the active layer 1110 of the eleventh transistor T11, and the active layer 1120 of the twelfth transistor T12 may extend along the second direction Y. The active layer 140 of the fourth transistor T4, the active layer 160 of the sixth transistor T6, and the active layer 1130 of the thirteenth transistor T13 may extend in the first direction X. However, this embodiment is not limited thereto.

In some exemplary implementations, the active layer 130 of the third transistor T3 is located between the active layer 110 of the first transistor T1 and the active layer 1120 of the twelfth transistor T12 in the second direction Y. The active layer 120 of the second transistor T2 and the active layer 1110 of the eleventh transistor T11 are adjacent in the second direction Y. The active layer 180 of the eighth transistor T8 is located between the active layer 170 of the seventh transistor T7 and the active layer 150 of the fifth transistor T5 in the second direction Y. The active layer of the ninth transistor T9 and the active layer of the tenth transistor T10 are sequentially arranged in the second direction Y. The active layer 160 of the sixth transistor T6 is located between the active layer 120 of the second transistor T2 and the active layer 180 of the eighth transistor T8 in the first direction X. The active layer 1130 of the thirteenth transistor T13 is located at a side of the active layer 150 of the fifth transistor T5 away from the active layer 1100 of the tenth transistor T10 in the first direction X.

In some exemplary implementations, the active layer of each transistor includes a channel area and first partitions 11-1 to 113-1 and second partitions 11-2 to 113-2 on both sides of the channel area, respectively. The second partition 19-2 of the active layer of the ninth transistor T9 and the second partition 110-2 of the active layer of the tenth transistor T10 may be an integrated structure connected with each other. The first partition 15-1 of the active layer of the fifth transistor T5, the first partition 18-1 of the active layer of the eighth transistor T8, and the first partition 113-1 of the active layer of the thirteenth transistor T13 may be an integrated structure connected with each other.

In some exemplary implementations, orthographic projections of the active layer 150 of the fifth transistor T5, the active layer 180 of the eighth transistor T8, and the active layer 1120 of the twelfth transistor T12 on the base substrate may be L-shaped. Orthographic projections of the active layer 110 of the first transistor T1, the active layer 120 of the second transistor T2, the active layer 130 of the third transistor T3, the active layer 140 of the fourth transistor T4, the active layer 160 of the sixth transistor, and the active layer 170 of the seventh transistor T7 on the base substrate may be dumbbell-shaped. The active layer 190 of the ninth transistor T9 and the active layer 1100 of the tenth transistor T10 may be rectangular. However, this embodiment is not limited thereto.

In some exemplary implementations, a material of the first semiconductor layer may include, for example, poly-silicon. The channel area may not be doped with an impurity, and has characteristics of a semiconductor. The first partition and the second partition may be disposed on two sides of the channel area and doped with impurities, and thus are conductive. The impurities may be changed according to a type of a transistor.

Figure 10A:
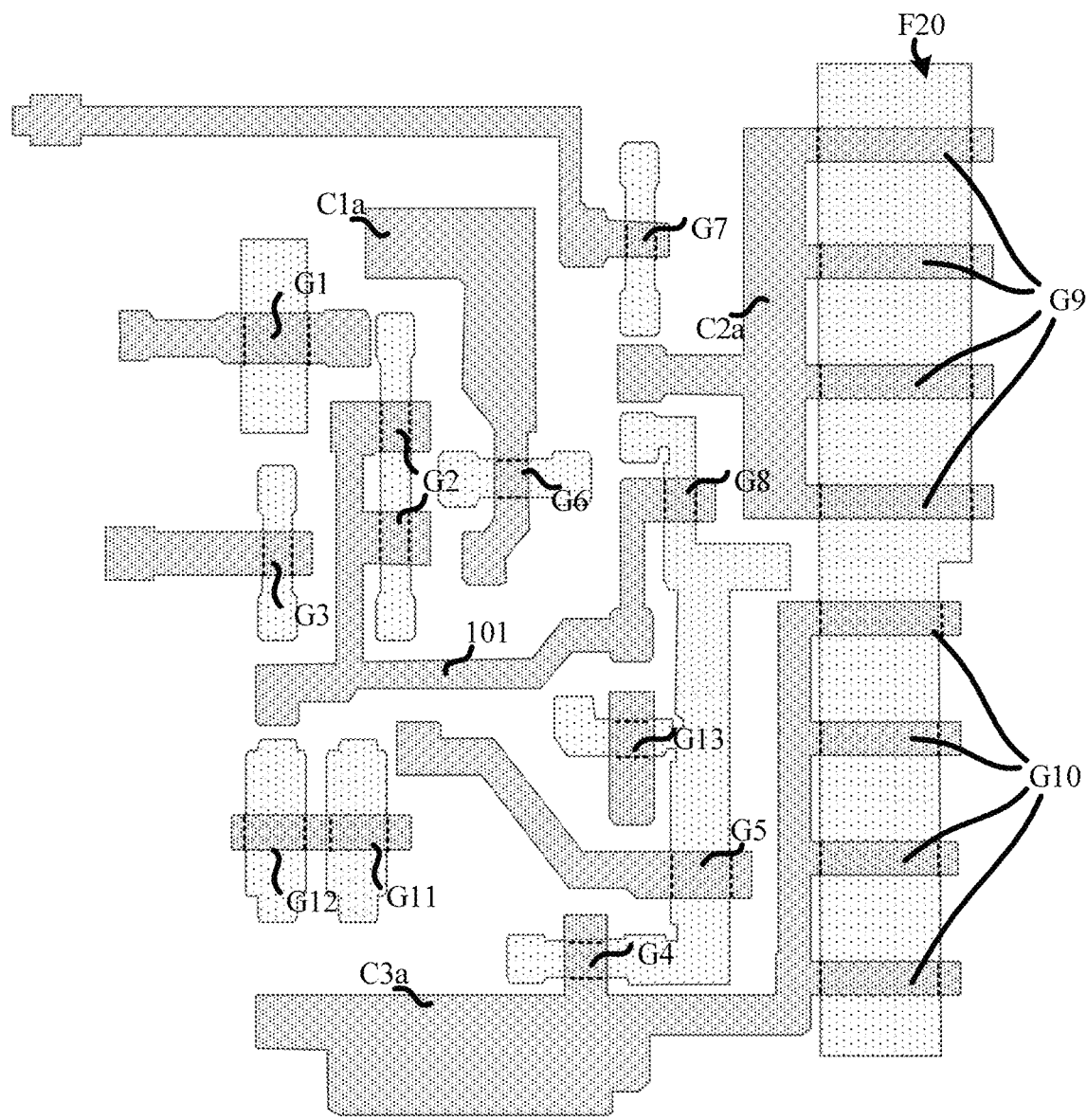
FIG. 10a is a schematic planar view of the display substrate shown in FIG. 7 after the first conductive layer is formed.
Figure 10B:
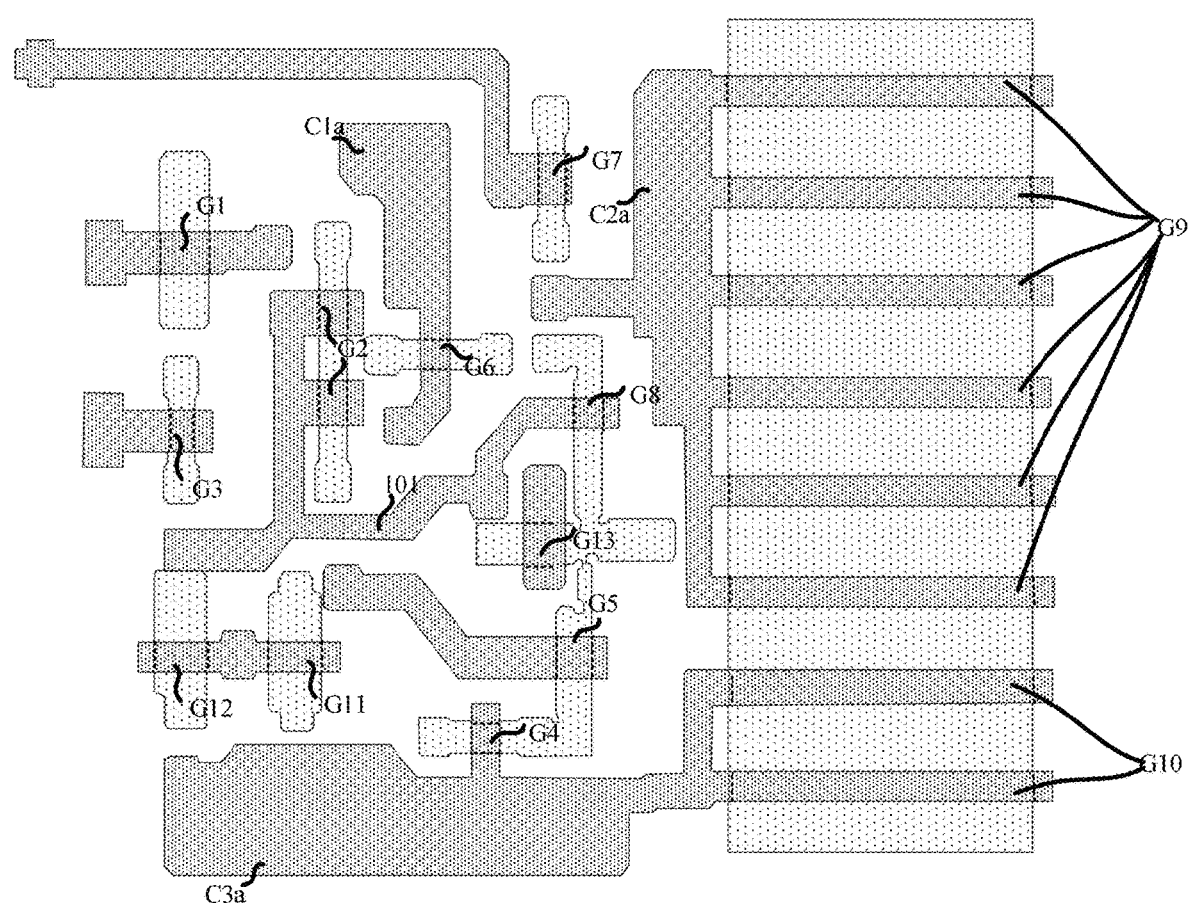
FIG. 10b is a schematic planar view of the display substrate shown in FIG. 8 after the first conductive layer is formed.

(3) Forming a pattern of a first conductive layer. In some exemplary implementations, forming a pattern of a first conductive layer includes: depositing a first insulation thin film and a first conductive thin film in sequence on the base substrate where the aforementioned patterns are formed, and patterning the first conductive thin film through a patterning process to form a first insulation layer covering the pattern of the first semiconductor layer and the pattern of the first conductive layer disposed on the first insulation layer, as shown in FIGS. 10a and 10b. In some examples, the pattern of the first conductive layer may include gate electrodes of a plurality of transistors (e.g. transistors T1 to T13) of the GOA circuit, first electrode plates of a plurality of capacitors (e.g. first capacitors C1 to third capacitors C3) of the GOA circuit.

In some exemplary implementations, the first conductive layer may include a gate electrode G1 of the first transistor T1, a gate electrode G2 of the second transistor T2, a gate electrode G3 of the third transistor T3, a gate electrode G4 of the fourth transistor T4, a gate electrode G5 of the fifth transistor T5, a gate electrode G6 of the sixth transistor T6, a gate electrode G7 of the seventh transistor T7, a gate electrode G8 of the eighth transistor T8, a gate electrode G9 of the ninth transistor T9, a gate electrode G10 of the tenth transistor T10, a gate electrode G11 of the eleventh transistor T11, a gate electrode G12 of the twelfth transistor T12, a gate electrode G13 of the thirteenth transistor T13, a first electrode plate C1a of the first capacitor C1, a first electrode plate C2a of the second capacitor C2 and a first electrode plate C3a of the third capacitor C3.

In some exemplary implementations, the first conductive layer further includes a first connection electrode 101. The first connection electrode 101 and the gate electrode G2 of the second transistor T2 and the gate electrode G8 of the eighth transistor may form an integrated structure.

In some exemplary implementations, the gate electrode G11 of the eleventh transistor T11 and the gate electrode G12 of the twelfth transistor T12 may form an integrated structure. The gate electrode G4 of the fourth transistor T4, the first electrode plate C3a of the third capacitor C3, and the gate electrode G10 of the tenth transistor T10 may form an integrated structure. The gate electrode G6 of the sixth transistor T6 and the first electrode plate C1a of the first capacitor C1 may form an integrated structure. The gate electrode G9 of the ninth transistor T9 and the first electrode plate C2a of the second capacitor C2 may form an integrated structure. However, this embodiment is not limited thereto.

In some exemplary implementations, the ninth transistor T9 and the tenth transistor T10 may be a transistor with a plurality of gates to prevent and reduce the occurrence of leakage current. However, this embodiment is not limited thereto.

In some exemplary implementations, the ninth transistor T9 includes a plurality of gate electrodes G9 arranged in parallel and at intervals, the tenth transistor T10 includes a plurality of gate electrodes G10 arranged in parallel and at intervals, the quantity of gate electrodes G9 of the ninth transistor T9 in the second gate driving circuit GOA-2 is greater than the quantity of gate electrodes G9 of the ninth transistor T9 in the first gate driving circuit GOA-1; the quantity of gate electrodes G10 of the tenth transistor T10 in the second gate driving circuit GOA-2 is smaller than the quantity of gate electrodes G10 of the tenth transistor T10 in the first gate driving circuit GOA-1.

In some exemplary implementations, in the second gate driving circuit GOA-2, the quantity of gate electrodes G9 of the ninth transistor T9 is 6, and the quantity of gate electrodes G10 of the tenth transistor T10 is 2.

In some exemplary implementations, in the first gate driving circuit GOA-1, the quantity of gate electrodes G9 of the ninth transistor T9 is 4, and the quantity of gate electrodes G10 of the tenth transistor T10 is 4.

Figure 11A:
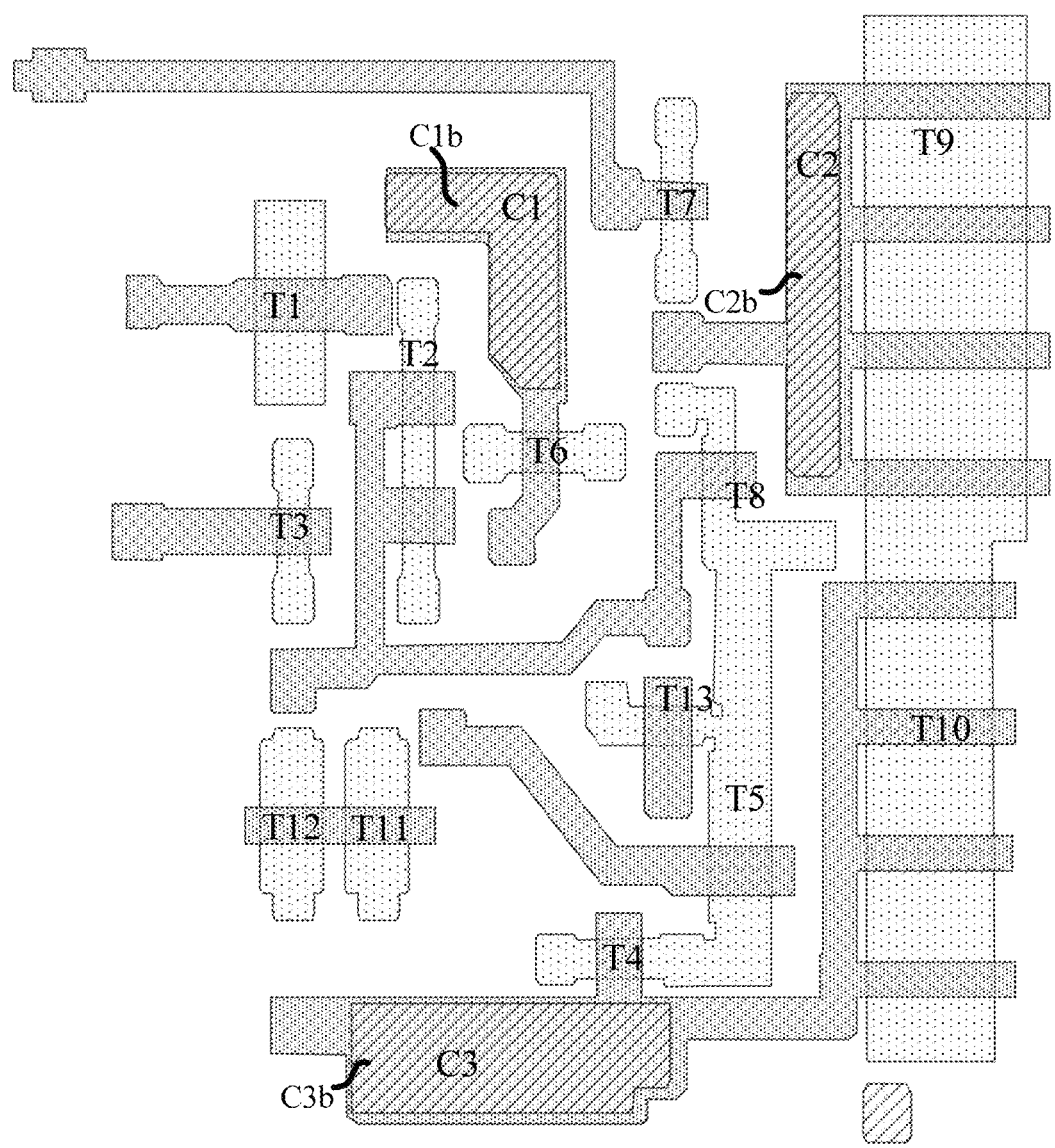
FIG. 11a is a schematic planar view of the display substrate shown in FIG. 7 after the second conductive layer is formed.
Figure 11B:
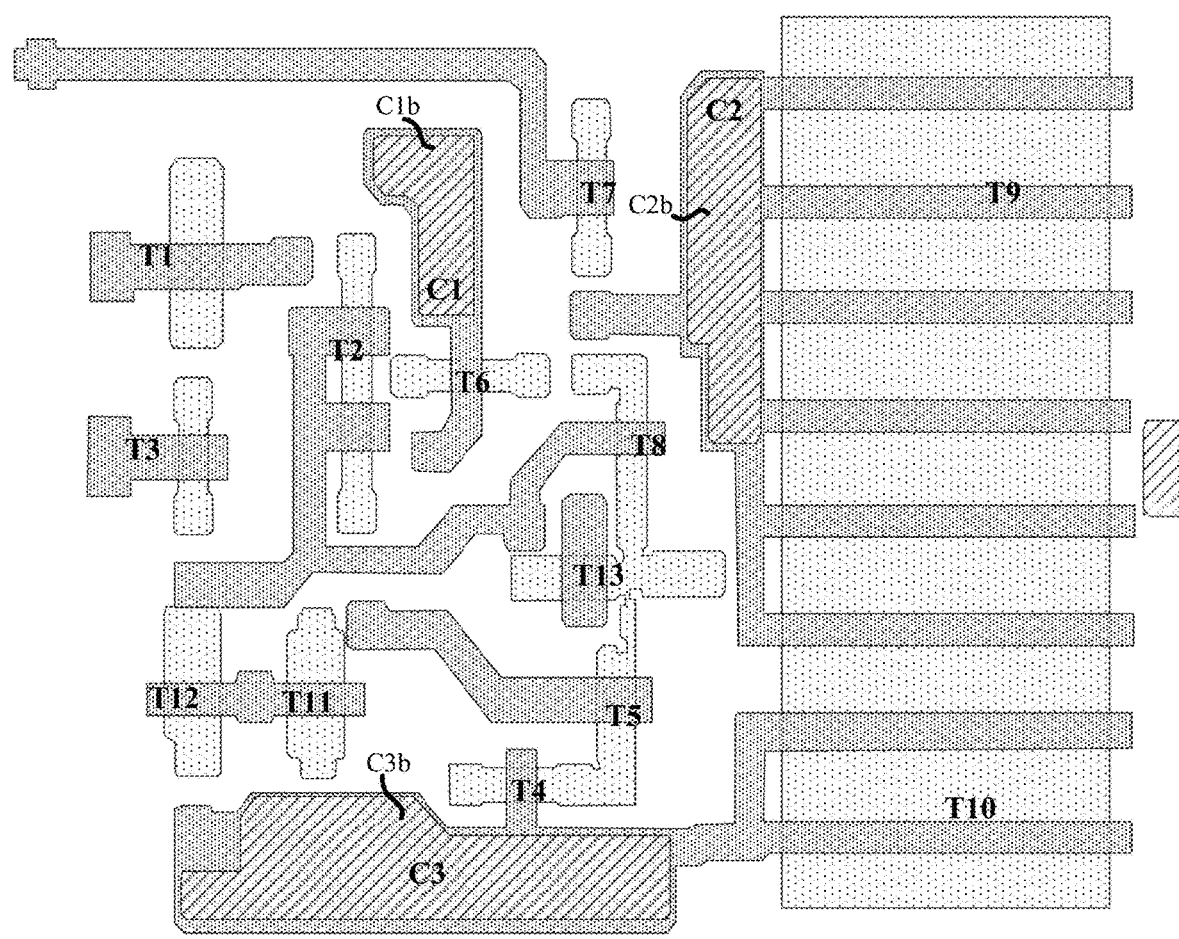
FIG. 11b is a schematic planar view of the display substrate shown in FIG. 8 after the second conductive layer is formed.

(4) Forming a pattern of a second conductive layer. In some exemplary implementations, forming a pattern of a second conductive layer includes: depositing a second insulation thin film and a second conductive thin film in sequence on the base substrate where the aforementioned patterns are formed, and patterning the second conductive thin film through a patterning process to form a second insulation layer covering the first conductive layer and a pattern of the second conductive layer disposed on the second insulation layer, as shown in FIG. 11a or FIG. 11b. In some examples, the pattern of the second conductive layer may include second electrode plates of a plurality of capacitors (e.g. a first capacitor C1 to a third capacitor C3) of the GOA circuit.

In some exemplary implementations, the second conductive layer may include a second electrode plate C1b of the first capacitor C1, a second electrode plate C2b of the second capacitor C2, and a second electrode plate C3b of the third capacitor C3. However, this embodiment is not limited thereto.

In some exemplary implementations, a projection of the second electrode plate C1b of the first capacitor C1 on the base substrate is overlapped with a projection of the first electrode C1a plate of the first capacitor C1 on the base substrate 60. A projection of the second electrode C2b plate of the second capacitor C2 on the base substrate is overlapped with a projection of the first electrode plate C2a of the second capacitor C2 on the base substrate. A projection of the second electrode plate C3b of the third capacitor C3 on the base substrate is overlapped with a projection of the first electrode plate C3a of the third capacitor C3 on the base substrate.

Figure 12A:
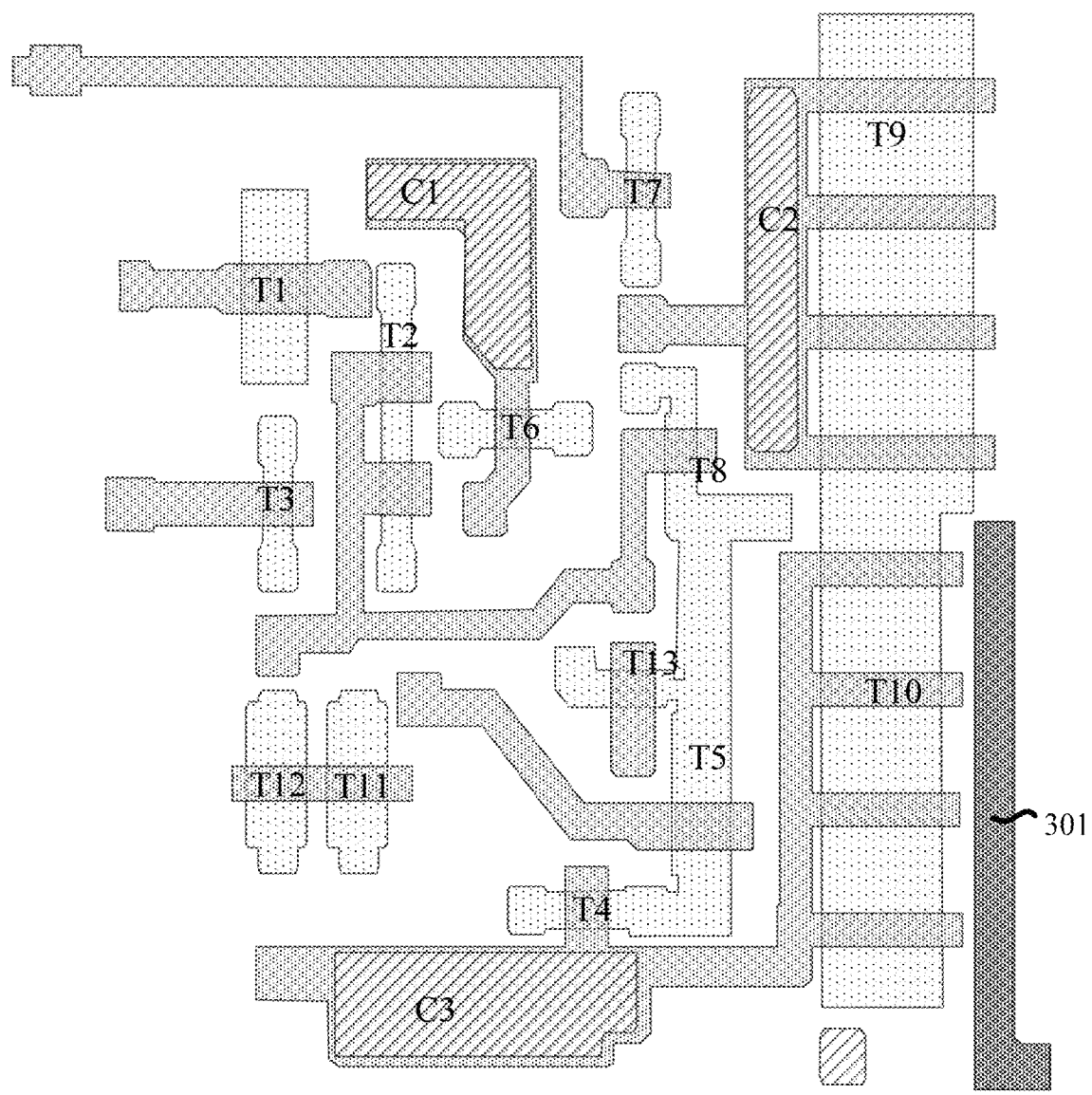
FIG. 12a is a schematic planar view of the display substrate shown in FIG. 7 after the third conductive layer is formed.

(5) Forming a pattern of a third conductive layer. In some exemplary implementations, forming a pattern of a third conductive layer includes: depositing a third insulation thin film and a third conductive thin film in sequence on the base substrate where the aforementioned patterns are formed, and patterning the third conductive thin film through a patterning process to form a third insulation layer covering the second conductive layer and a pattern of a third conductive layer disposed on the third insulation layer, as shown in FIG. 12a. In some examples, in the GOA-1 circuit, the pattern of the third conductive layer may include a second connection electrode 301. The second connection electrode 301 is configured to be connected with the sixth connection electrode 404 formed later through a fourth via E1 formed later, and connected with the second electrodes D10-1, D10-2 of the tenth transistor T10 formed later through a fourth via E2 formed later.

Figure 13A:
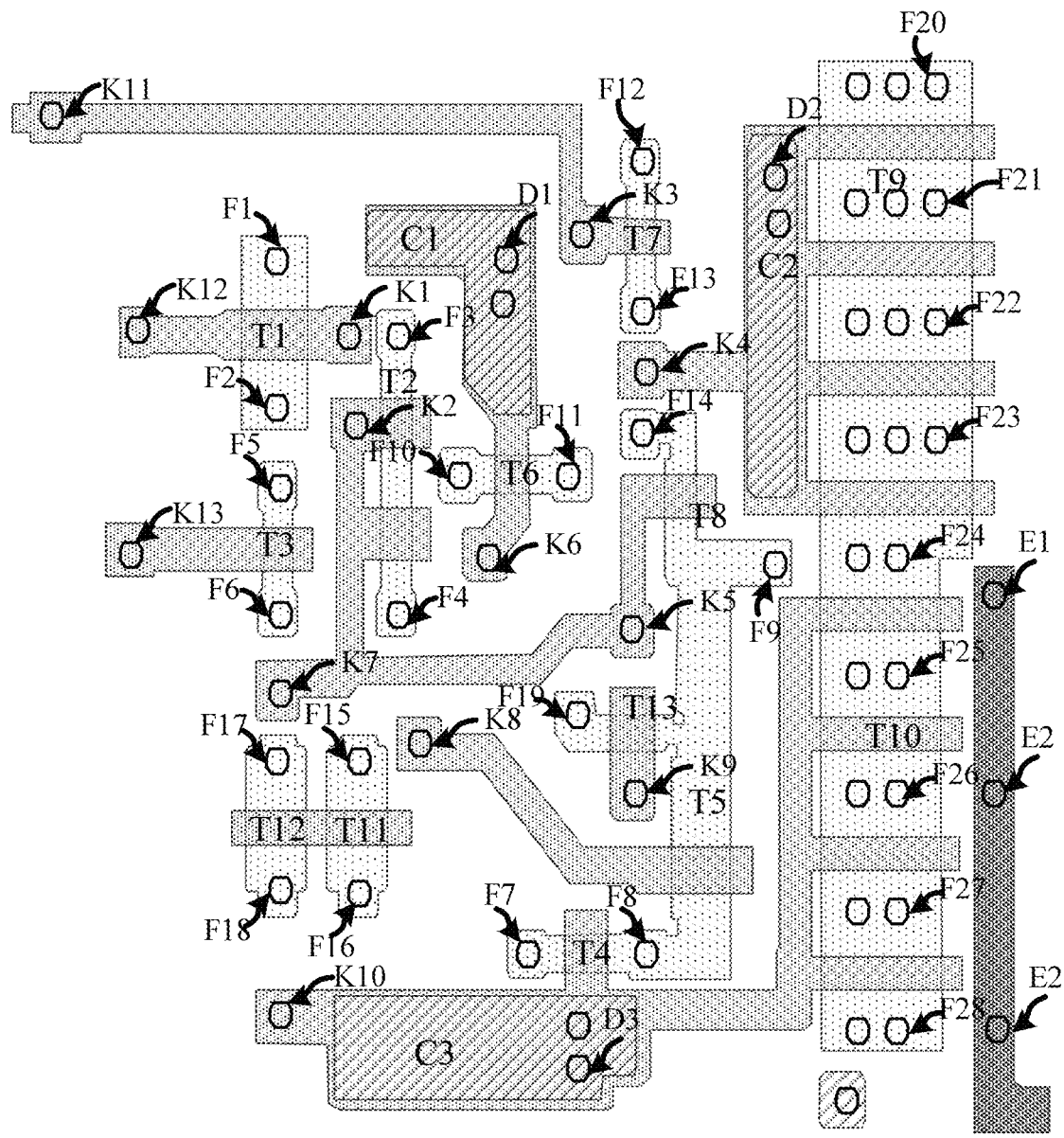
FIG. 13a is a schematic planar view of the display substrate shown in FIG. 7 after the fourth insulation layer is formed.
Figure 13B:
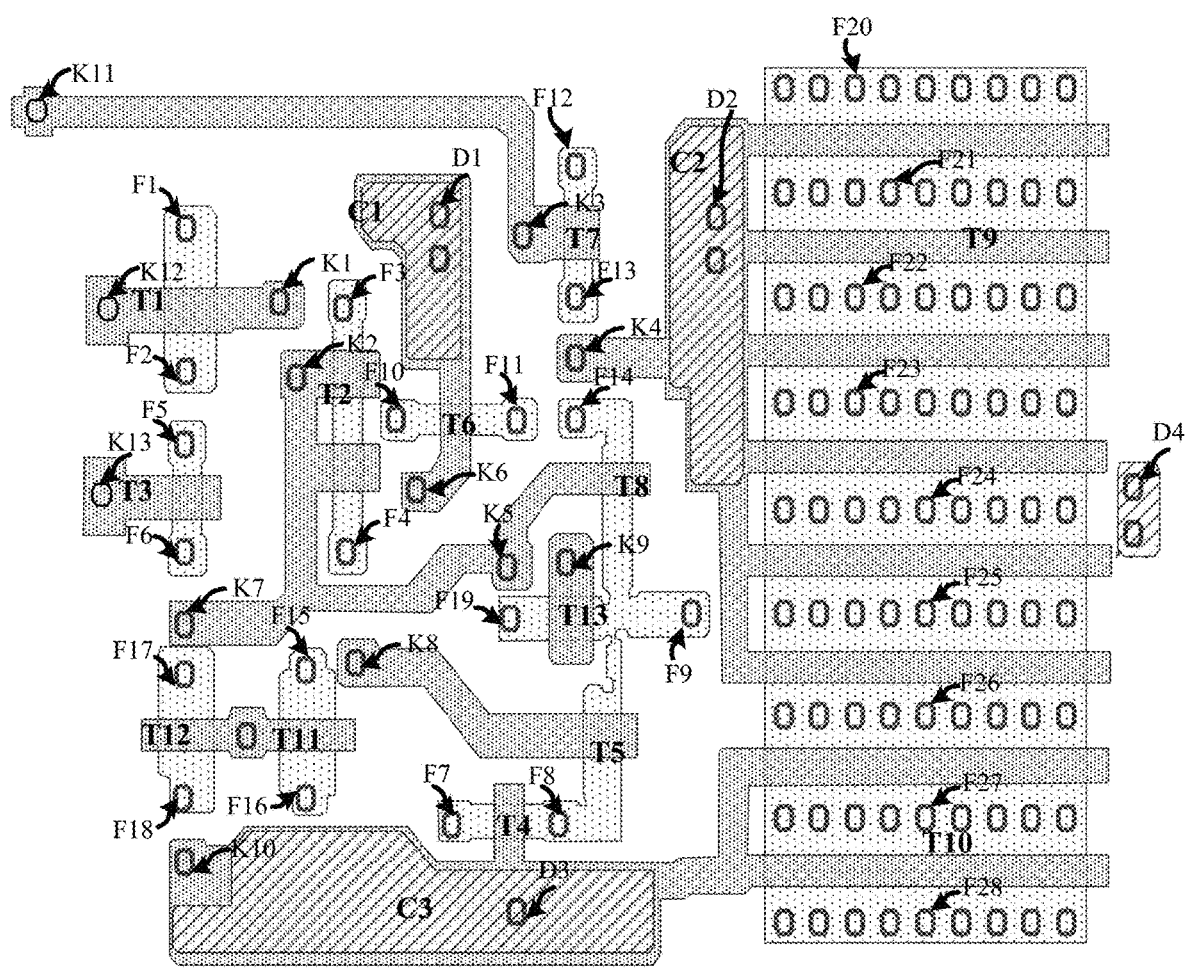
FIG. 13b is a schematic planar view of the display substrate shown in FIG. 8 after the fourth insulation layer is formed.

(6) Forming a pattern of a fourth insulation layer. In some exemplary implementations, forming a pattern of a fourth insulation layer includes: depositing a fourth insulation thin film on the base substrate where the aforementioned patterns are formed, and patterning the fourth insulation thin film through a patterning process to form the pattern of the fourth insulation layer covering the second conductive layer, as shown in FIGS. 13a and 13b. In some examples, a plurality of vias are opened on the fourth insulation layer. The plurality of vias at least include a plurality of first vias F1 to F28, a plurality of second vias K1 to K13, a plurality of third vias D1 to D4, and a plurality of fourth vias E1 to E2. The fourth insulation layer, the third insulation layer, and the second insulation layer and the first insulation layer in the plurality of first vias F1 to F28 are etched away to expose a surface of the first semiconductor layer. The fourth insulation layer, the third insulation layer and the second insulation layer in the plurality of second vias K1 to K13 are etched away to expose a surface of the first conductive layer. The fourth insulation layer and a third insulation layer in the plurality of third vias D1 to D4 are etched away to expose a surface of second conductive layer. The fourth insulation layer in the fourth vias E1 to E2 is etched away to expose a surface of the third conductive layer.

Figure 14A:
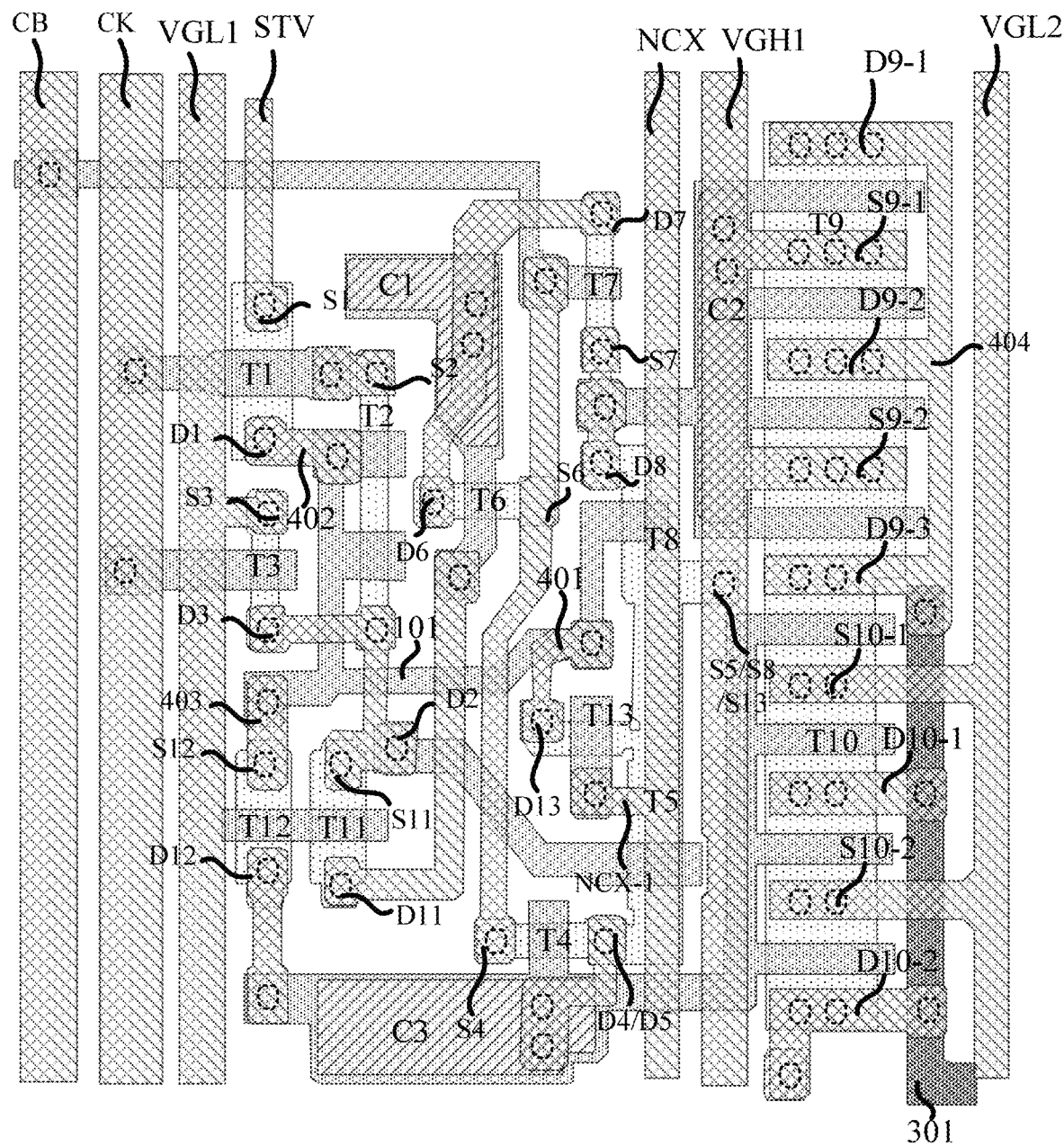
FIG. 14a is a schematic planar view of the display substrate shown in FIG. 7 after the fourth conductive layer is formed.
Figure 14B:
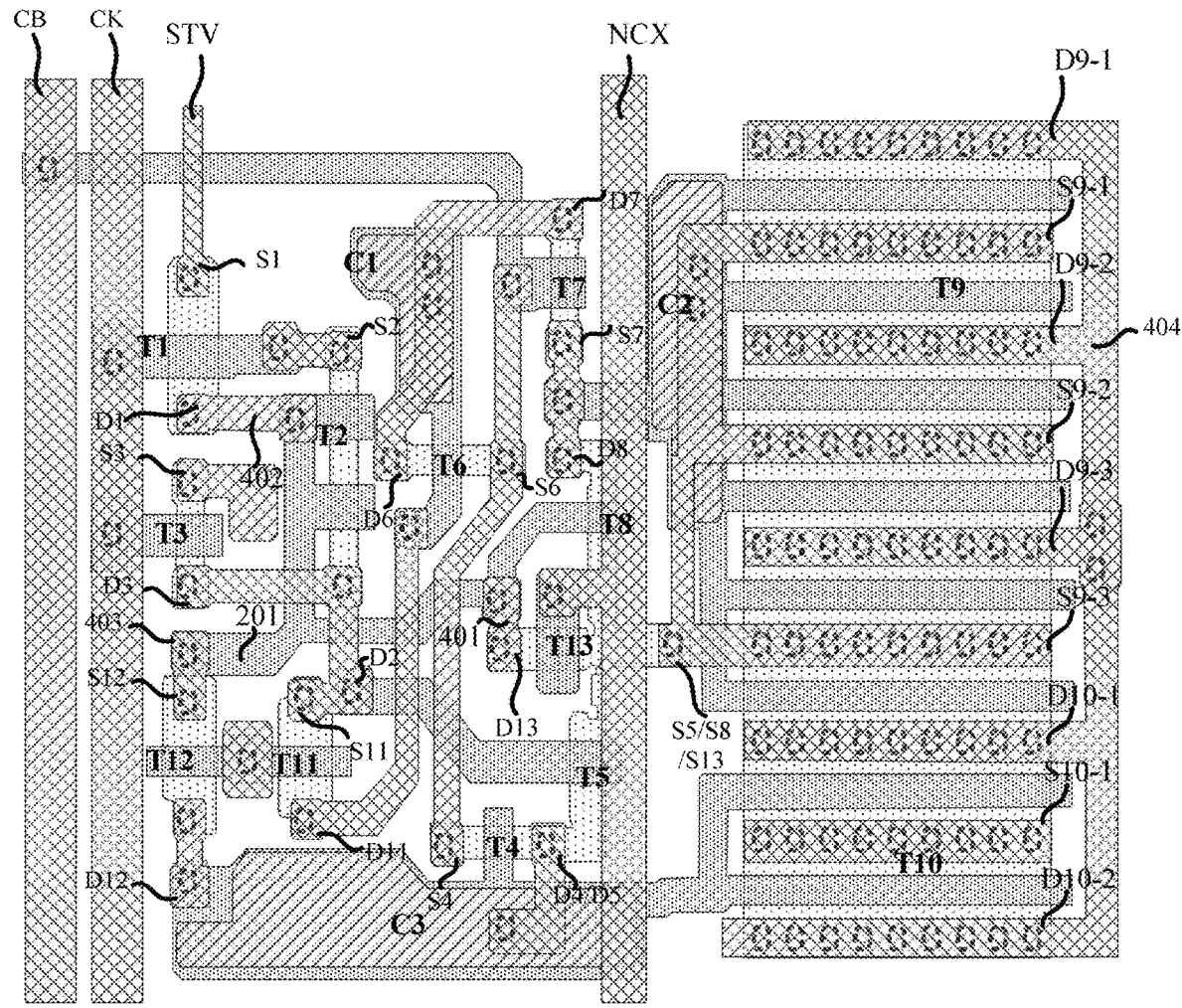
FIG. 14b is a schematic planar view of the display substrate shown in FIG. 8 after the fourth conductive layer is formed.

(7) Forming a pattern of a fourth conductive layer. In some exemplary implementations, forming a pattern of a fourth conductive layer includes: depositing a fourth conductive thin film on the base substrate where the aforementioned patterns are formed, and patterning the fourth conductive thin film through a patterning process to form the pattern of the fourth conductive layer on the fourth insulation layer, as shown in FIGS. 14a and 14b. In some examples, the fourth conductive layer pattern may include first electrodes S1 to S13 and second electrodes D1 to D13 of a plurality of transistors (e.g. first transistors T1 to thirteenth transistors T13) of the GOA circuit, a plurality of clock signal lines (e.g. first clock signal line CK, second clock signal line CB and third clock signal line NCX) and a plurality of power supply lines (e.g. initial signal line STV, first high voltage line VGH1, second low voltage line VGL1 to VGL2).

In some exemplary implementations, the first electrode S3 of the third transistor T3 and the second low voltage line VGL1 may form an integrated structure. The first electrode S1 of the first transistor T1 and the initial signal line STV may form an integrated structure. The second electrode D2 of the second transistor T2, the second electrode D3 of the third transistor T3, and the first electrode S11 of the eleventh transistor T11 may form an integrated structure. The second electrode D4 of the fourth transistor T4 and the second electrode D5 of the fifth transistor T5 may be form an integrated structure. The first electrodes S10-1, S10-2 and the second low voltage line VGL2 of the tenth transistor T10 may form an integrated structure. The first electrode S5 of the fifth transistor T5, the first electrode S8 of the eighth transistor T8, the first electrodes S9-1 to S9-2 of the ninth transistor T9, the first electrode S13 of the thirteenth transistor T13 and the first high voltage line VGH1 may form an integrated structure. The second electrode D8 of the eighth transistor T8 and the first electrode S7 of the seventh transistor T7 may form an integrated structure. The second electrode D6 of the sixth transistor T6 and the second electrode D7 of the seventh transistor T7 may form an integrated structure.

In some exemplary implementations, in the GOA-1 and GOA-2 circuits, the fourth conductive layer pattern may further include a third connection electrode 401, a fourth connection electrode 402, a fifth connection electrode 403, and a sixth connection electrode 404, wherein the third connection electrode 401 and the second electrode D13 of the thirteenth transistor T13 form an integrated structure, the fourth connection electrode 402 and the second electrode D1 of the first transistor T1 form an integrated structure, the fifth connection electrode 403 and the first electrode S12 of the twelfth transistor T12 form an integrated structure, and the first connection electrode 101 is connected with the third connection electrode 401 through the second via K5, the first connection electrode 101 is connected with the fourth connection electrode 402 through the second via K2, and the first connection electrode 101 is connected with the fifth connection electrode 403 through the second via K7.

In some exemplary implementations, in the GOA-1 circuit, the sixth connection electrode 404 and the second electrodes D9-1 to D9-3 of the ninth transistor form an integrated structure, the second connection electrode 301 is connected with the sixth connection electrode 404 through the fourth via E1, and the second connection electrode 301 is connected with the second electrodes D10-1 to D10-2 of the tenth transistor through the fourth via E2.

In some exemplary implementations, in the GOA-2 circuit, the sixth connection electrode 404 form an integrated structure with the second electrodes D9-1 to D9-3 of the ninth transistor and the second electrodes D10-1 to D10-2 of the tenth transistor. However, this embodiment is not limited thereto.

Figure 7:
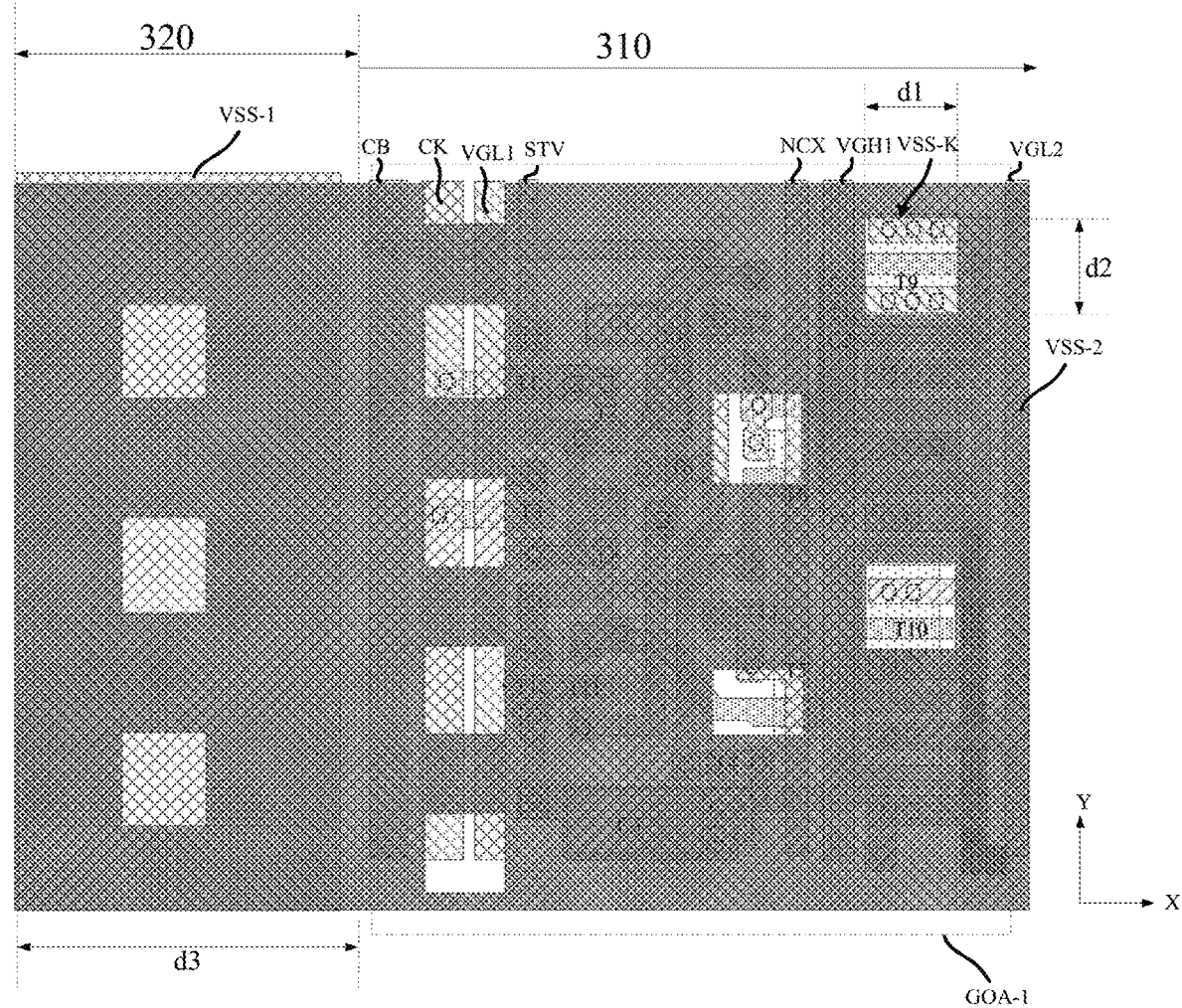
FIG. 7 is a schematic diagram of a planar structure of a partition area and a first gate driving circuit area in a display substrate according to an embodiment of the present disclosure.
Figure 8:
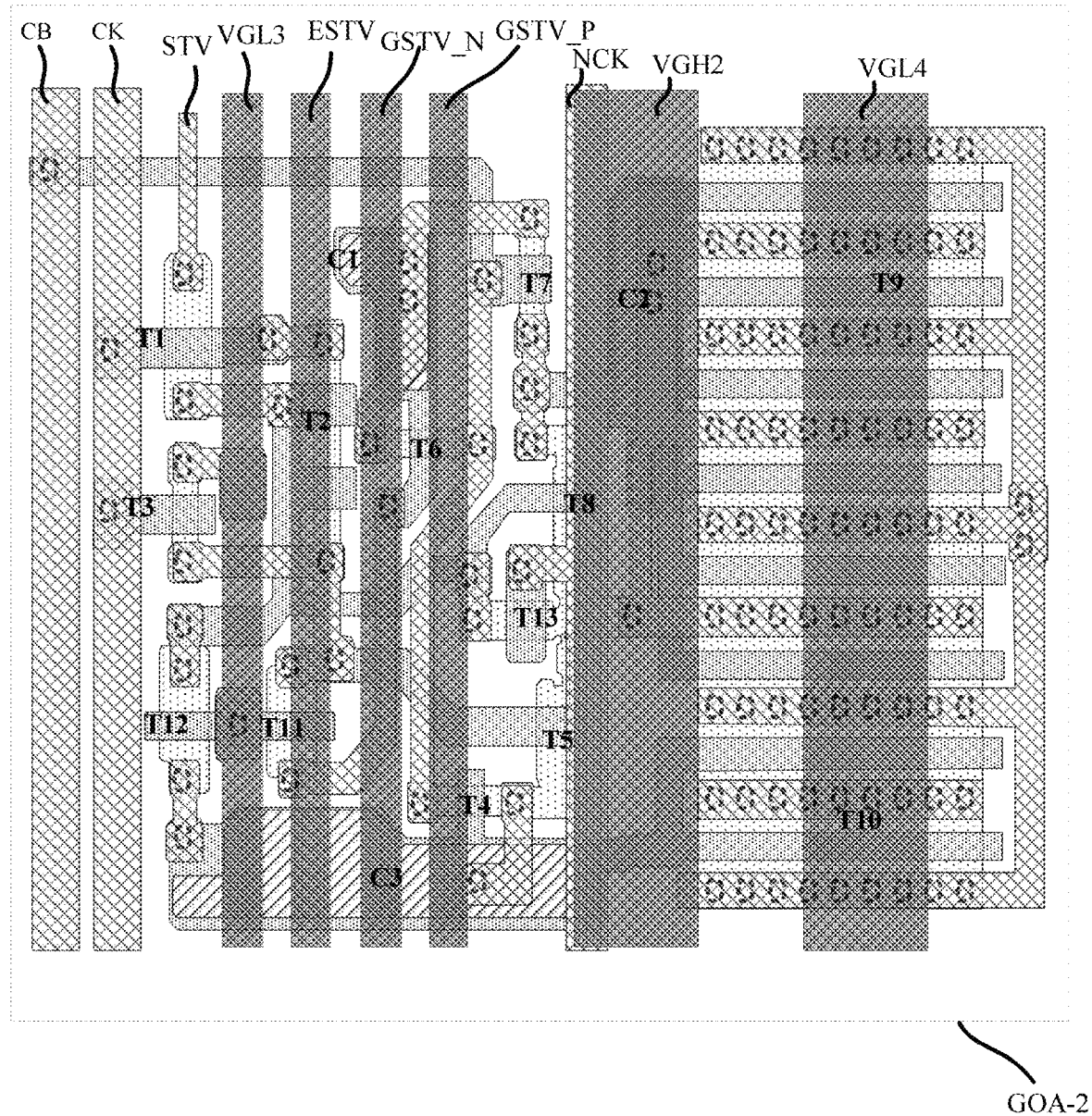
FIG. 8 is a schematic diagram of a planar structure of a second gate driving circuit area in a display substrate according to an embodiment of the present disclosure.

(7) Forming a pattern of a fifth conductive layer. In some exemplary implementations, forming a pattern of a fifth conductive layer includes: depositing a first planarization thin film and a fifth conductive thin film on the base substrate where the aforementioned patterns are formed, patterning the first planarization thin film and the fifth conductive thin film through a patterning process, and forming patterns of a first planarization layer and a fifth conductive layer on the fourth conductive layer, as shown in FIGS. 7 and 8. In some examples, the pattern of the fifth conductive layer may include a second branch VSS-2 of the second power supply line, a first high voltage line VGH2, second low voltage lines VGL3 to VGL4, a plurality of initial signal lines (e.g., a first initial signal line ESTV for providing an initial signal to the first gate driving circuit GOA-1, a second initial signal line GSTV_N for providing an initial signal to the second gate driving circuit GOA-2, and a third initial signal line GSTV_P for providing an initial signal to the third gate driving circuit GOA-3).

In some exemplary implementations, the second branch VSS-2 of the second power supply line may be located above the partition area 320 and the GOA-1 circuit. The second branch VSS-2 of the second power supply line includes a plurality of exhaust openings for forming exhaust paths through which gas components in the first planarization layer can be evaporated during the process, thereby preventing the gas components in the first planarization layer from damaging the organic light emitting layer in the pixel.

In some exemplary implementations, the first high voltage line VGH2, the second low voltage lines VGL3 to VGL4, and the plurality of initial signal lines (e.g., a first initial signal line ESTV, a second initial signal line GSTV_N, and a third initial signal line GSTV_P) may be located above the GOA-2 circuit.

In some exemplary implementations, a pixel circuit may be formed in the display area while the GOA circuit is formed in the non-display area. For example, a first semiconductor layer of the display area may include active layers of transistors of a pixel circuit, a first conductive layer of the display area may include gate electrodes of transistors of the pixel circuit and a first electrode of a storage capacitor, a second conductive layer of the display area may at least include a second electrode of the storage capacitor of the pixel circuit, and a third conductive layer of the display area may at least include a first electrode and a second electrode of the transistor of the pixel circuit. After the first conductive layer is formed, a second semiconductor layer may be formed in the display area, and an insulation layer is disposed between the second semiconductor layer and the first conductive layer. A material of the second semiconductor film may be a metal oxide, for example, In—Ga—Zn—O (IGZO). However, a position of the second semiconductor layer is not limited in the embodiment.

In some exemplary implementations, after the fifth conductive layer is formed, patterns of a second planarization layer, an anode layer, a pixel definition layer, an organic light emitting layer, a cathode layer, and an encapsulation layer may be sequentially formed in the display area. In some examples, a second planarization thin film is coated on the base substrate where the aforementioned patterns are formed, and a pattern of a second planarization layer is formed by masking, exposing and developing the second planarization thin film. Then, an anode thin film is deposited on the base substrate of the display area where the aforementioned patterns are formed, and the anode thin film is patterned through a patterning process to form a pattern of an anode on the second planarization layer. Next, on the base substrate where the aforementioned patterns are formed, a pixel definition thin film is coated, and a pattern of a Pixel Definition layer (PDL) is formed through masking, exposure, and development processes. The pixel definition layer is formed in each sub-pixel in the display area. A pixel opening exposing the anode is formed in the pixel definition layer in each sub-pixel. Subsequently, an organic emitting layer is formed within the pixel openings formed above, and the organic emitting layer is connected with an anode. Subsequently, a cathode thin film is deposited, and the cathode thin film is patterned through a patterning process to form a pattern of a cathode. Then, an encapsulation layer is formed on the cathode. The encapsulation layer may include a stacked structure of an inorganic material/an organic material/an inorganic material.

In some exemplary implementations, the first conductive layer, the second conductive layer, the third conductive layer, the fourth conductive layer and the fifth conductive layer may be made of a metal material, such as any one or more of silver (Ag), copper (Cu), aluminum (Al) and molybdenum (Mo), or an alloy material of the above metals, such as aluminum neodymium alloy (AlNd) or molybdenum niobium alloy (MoNb), and may be a single-layer structure or a multi-layer composite structure, such as Mo/Cu/Mo. The first insulation layer, the second insulation layer, the third insulation layer and the fourth insulation layer may be made of any one or more of silicon oxide (SiOx), silicon nitride (SiNx) and silicon oxynitride (SiON), and may be a single layer, multiple layers, or a composite layer. The first planarization layer may be made of an organic material, e.g., polyimide, acrylic, or polyethylene terephthalate. The first insulation layer and the second insulation layer is referred to as Gate Insulation (GI) layers, the third insulation layer is referred to as an Interlayer Dielectric (ILD) layer, and the fourth insulation layer is referred to as a passivation layer. The pixel definition layer may be made of an organic material, such as polyimide, acrylic, or polyethylene terephthalate. The anode may be made of a transparent conductive material, e.g., Indium Tin Oxide (ITO) or Indium Zinc Oxide (IZO). The cathode may be made of any one or more of Magnesium (Mg), Argentum (Ag), Aluminum (Al), Copper (Cu), and Lithium (Li), or an alloy made of any one or more of the aforementioned metals. However, this embodiment is not limited thereto. For example, the anode may be made of a reflective material such as a metal, and the cathode may be made of a transparent conductive material.

The structure and the manufacturing process thereof shown in the exemplary implementations are merely illustrative. In some exemplary implementation modes, a corresponding structure may be changed and a patterning process may be increased or decreased according to actual needs. The manufacturing process of this exemplary implementation may be implemented using an existing mature manufacturing device, and may be compatible well with an existing manufacturing process, simple in process implementation, easy to implement, high in a production efficiency, low in production cost, and high in yield rate.

An embodiment of the present disclosure further provides a display apparatus, which includes the display substrate as described above. In some exemplary implementations, the display substrate may be a flexible OLED display substrate, a QLED display substrate, a Micro-LED display substrate or a Mini-LED display substrate. The display apparatus may be any product or component with a display function, such as an OLED display apparatus, a watch, a mobile phone, a tablet computer, a television, a display, a laptop computer, a digital photo frame, and a navigator. However, this embodiment is not limited thereto.

The embodiment of the present disclosure further provides a method for manufacturing a display substrate. The display substrate includes a display area and a bezel area on at least one side of the display area, wherein the bezel area includes a circuit area and a partition area which are sequentially arranged in a direction away from the display area, the circuit area includes a third gate driving circuit, a second gate driving circuit and a first gate driving circuit which are sequentially arranged in a direction away from the display area, the partition area includes a power supply line, the power supply line includes a first branch and a second branch, and the manufacturing method includes:

forming a first semiconductor layer, a first conductive layer, a second conductive layer, a second semiconductor layer, a third conductive layer, a fourth conductive layer and a fifth conductive layer in sequence on a base substrate, wherein the first semiconductor layer includes active layers of a plurality of polysilicon transistors, the first conductive layer includes gate electrodes of a plurality of polysilicon transistors and a first plate of a storage capacitor, the second conductive layer includes a second plate of a storage capacitor, the second semiconductor layer includes active layers of a plurality of oxide transistors, the third conductive layer includes gate electrodes of a plurality of oxide transistors, the fourth conductive layer includes first electrodes and second electrodes of a plurality of polysilicon transistors; first electrodes and second electrodes of a plurality of oxide transistors and a first branch of the power supply line, and the fifth conductive layer includes a second branch of the power supply line; an orthographic projection of the second branch of the power supply line on the base substrate and an orthographic projection of the first branch of the power supply line on the base substrate have an overlapped area, and the orthographic projection of the second branch of the power supply line on the base substrate and an orthographic projection of the first gate driving circuit on the base substrate have an overlapped area; the orthographic projection of the first branch of the power supply line on the base substrate and the orthographic projection of the first gate driving circuit on the base substrate do not have an overlapped area.

The drawings of the present disclosure only involve structures involved in the present disclosure, and other structures may refer to conventional designs. The embodiments of the present disclosure and features in the embodiments may be combined to each other to obtain new embodiments if there is no conflict. Those of ordinary skills in the art should understand that modifications or equivalent replacements may be made on the technical solutions of the present disclosure without departing from the spirit and scope of the technical solutions of the present disclosure, and shall all fall within the scope of the claims of the present disclosure.

The invention claimed is:

1. A display substrate, comprising a display area and a bezel area located on at least one side of the display area, wherein:
   the bezel area comprises a circuit area and a partition area which are sequentially arranged in a direction away from the display area, the circuit area comprises a third gate driving circuit, a second gate driving circuit and a first gate driving circuit which are sequentially arranged in the direction away from the display area, the partition area comprises a power supply line, the power supply line comprises a first branch and a second branch;
   in a direction perpendicular to the display substrate, the display substrate comprises a first semiconductor layer, a first conductive layer, a second conductive layer, a second semiconductor layer, a third conductive layer, a fourth conductive layer and a fifth conductive layer arranged in sequence on a base substrate, the first semiconductor layer comprises active layers of a plurality of polysilicon transistors, the first conductive layer comprises gate electrodes of the plurality of polysilicon transistors and a first plate of a storage capacitor, the second conductive layer comprises a second plate of the storage capacitor, the second semiconductor layer includes active layers of a plurality of oxide transistors, the third conductive layer comprises gate electrodes of the plurality of oxide transistors, the fourth conductive layer comprises first electrodes and second electrodes of the plurality of polysilicon transistors, first electrodes and second electrodes of the plurality of oxide transistors and the first branch of the power supply line, the fifth conductive layer comprises the second branch of the power supply line; and
   there is an overlapping area between an orthographic projection of the second branch of the power supply line on the base substrate and an orthographic projection of the first branch of the power supply line on the base substrate, and there is an overlapping area between the orthographic projection of the second branch of the power supply line on the base substrate and an orthographic projection of the first gate driving circuit on the base substrate; there is no overlapping area between the orthographic projection of the first branch of the power supply line on the base substrate and the orthographic projection of the first gate driving circuit on the base substrate.

2. The display substrate according to claim 1, wherein there is no overlapping area between the orthographic projection of the second branch of the power supply line on the base substrate and an orthographic projection of the second gate driving circuit on the base substrate.

3. The display substrate according to claim 1, wherein the second branch of the power supply line comprises a plurality of exhaust openings arranged at intervals, and there is an overlapping area between an orthographic projection of the exhaust openings on the base substrate and the orthographic projection of the first branch of the power supply line and between the orthographic projection of the exhaust openings on the base substrate and the orthographic projection of the first gate driving circuit on the base substrate.

4. The display substrate according to claim 3, wherein an area of the orthographic projection of the exhaust openings on the base substrate is 5% to 15% of an area of the orthographic projection of the second branch of the power supply line on the base substrate.

5. The display substrate according to claim 1, wherein:
   the first gate driving circuit and the second gate driving circuit each comprises a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a first capacitor, a second capacitor and a third capacitor;
   a gate electrode of the first transistor, a first electrode of the second transistor and a gate electrode of the third transistor are all electrically connected with a first clock signal line, a first electrode of the first transistor is electrically connected with an input terminal, a second electrode of the first transistor is electrically connected with a gate electrode of the second transistor, a gate electrode of the eighth transistor, a first electrode of the twelfth transistor and a first electrode of the thirteenth transistor;
   a second electrode of the second transistor is electrically connected with a second electrode of the third transistor, a gate electrode of the fifth transistor, and a first electrode of the eleventh transistor;
   a first electrode of the third transistor, a first electrode of the tenth transistor, a gate electrode of the eleventh transistor and a gate electrode of the twelfth transistor are all electrically connected with a second low voltage line;
   a gate electrode of the fourth transistor is electrically connected with a second electrode of the twelfth transistor, a gate electrode of the tenth transistor and a first plate of the third capacitor, and a second electrode of the fourth transistor, a first electrode of the sixth transistor and a gate electrode of the seventh transistor are electrically connected with a second clock signal line;
   a first electrode of the fifth transistor, a first electrode of the eighth transistor, a first electrode of the ninth transistor, a second electrode of the thirteenth transistor and a second plate of the second capacitor are all electrically connected with a first high voltage line, and a second electrode of the fifth transistor is electrically connected with a first electrode of the fourth transistor and a second plate of the third capacitor;
   a gate electrode of the sixth transistor is electrically connected with a first plate of the first capacitor and a second electrode of the eleventh transistor, and a second electrode of the sixth transistor is electrically connected with a second plate of the first capacitor and a first electrode of the seventh transistor; and
   a second electrode of the seventh transistor is electrically connected with a second electrode of the eighth transistor, a gate electrode of the ninth transistor and a first plate of the second capacitor; a second electrode of the ninth transistor and a second electrode of the tenth transistor are electrically connected with an output terminal; a gate electrode of the thirteenth transistor is electrically connected with a third clock signal line.

6. The display substrate according to claim 5, wherein the first high voltage line comprises a first branch and a second branch, and the second low voltage line includes a first branch, a second branch, a third branch and a fourth branch; and
the first branch of the first high voltage line, the first branch of the second low voltage line, and the second branch of the second low voltage line are arranged in a same layer as the fourth conductive layer.

7. The display substrate according to claim 5, wherein: the first conductive layer comprises a first connection electrode, and the fourth conductive layer comprises a third connection electrode, a fourth connection electrode, and a fifth connection electrode; and
the first connection electrode is connected with the gate electrode of the second transistor and the gate electrode of the eighth transistor to form an integrated structure; the third connection electrode and the first electrode of the thirteenth transistor are connected with each other to form an integrated structure, the fourth connection electrode and the second electrode of the first transistor are connected with each other to form an integrated structure, and the fifth connection electrode and the first electrode of the twelfth transistor are connected with each other to form an integrated structure.

8. The display substrate according to claim 7, wherein in the first gate driving circuit, the third connection electrode is L-shaped.

9. The display substrate according to claim 8, wherein: the third clock signal line is arranged in the same layer as the fourth conductive layer, and the third clock signal line comprises a first protrusion connected with the gate electrode of the thirteenth transistor through a via; and
an active layer of the thirteenth transistor comprises a channel area, in the first gate driving circuit, a via through which the first protrusion is connected with the gate electrode of the thirteenth transistor and a via through which the first connection electrode is connected with the third connection electrode are respectively located at both sides of the channel area of the thirteenth transistor.

10. The display substrate according to claim 7, in the second gate driving circuit, the third connection electrode is in a shape of "1".

11. The display substrate according to claim 10, wherein: the third clock signal line is arranged in the same layer as the fourth conductive layer, and the third clock signal line comprises a first protrusion connected with the gate electrode of the thirteenth transistor through a via; and
an active layer of the thirteenth transistor comprises a channel area, in the second gate driving circuit, a via through which the first protrusion is connected with the gate electrode of the thirteenth transistor and a via through which the first connection electrode is connected with the third connection electrode are located at a same side of the channel area of the thirteenth transistor.

12. The display substrate according to claim 11, wherein the ninth transistor comprises a plurality of gate electrodes arranged in parallel and at intervals, the tenth transistor comprises a plurality of gate electrodes arranged in parallel and at intervals, and a quantity of gate electrodes of the ninth transistor in the second gate driving circuit is greater than a quantity of gate electrodes of the ninth transistor in the first gate driving circuit; a quantity of gate electrodes of the tenth transistor in the second gate driving circuit is smaller than a quantity of gate electrodes of the tenth transistor in the first gate driving circuit.

13. The display substrate according to claim 12, wherein in the second gate driving circuit, a length of each gate electrode of the ninth transistor along a first direction is between 30% and 40% of a width of the second gate driving circuit along the first direction, and a width of each gate electrode of the ninth transistor along a second direction is between 2% and 3% of a width of the second gate driving circuit along the first direction.

14. The display substrate according to claim 12, wherein the bezel area comprises a plurality of straight-line extension areas and a corner area disposed between the plurality of straight-line extension areas, and the circuit area further comprises a plurality of virtual gate driving circuit groups, each of the virtual gate driving circuit groups comprises at least one virtual gate driving circuit, the plurality of virtual gate driving circuit groups are dispersed around the display area in the corner area.

15. The display substrate according to claim 14, wherein a distance between two adjacent virtual gate driving circuit groups is between 1/6 and 1/3 of a length of the corner area.

16. The display substrate according to claim 1, further comprising a first planarization layer disposed between the fourth conductive layer and the fifth conductive layer, wherein the first planarization layer above the first gate driving circuit and the first planarization layer above the second gate driving circuit are continuously arranged.

17. A display apparatus, comprising: the display substrate according to claim 1.

18. A manufacturing method for a display substrate, wherein the display substrate comprises a display area and a bezel area located on at least one side of the display area, the bezel area comprises a circuit area and a partition area sequentially arranged in a direction away from the display area, the circuit area comprises a third gate driving circuit, a second gate driving circuit and a first gate driving circuit sequentially arranged in the direction away from the display area, the partition area comprises a power supply line and an isolation dam disposed on the power supply line, the power supply line comprises a first branch and a second branch, the manufacturing method comprises:
forming a first semiconductor layer, a first conductive layer, a second conductive layer, a second semiconductor layer, a third conductive layer, a fourth conductive layer and a fifth conductive layer in sequence on a base substrate, wherein the first semiconductor layer comprises active layers of a plurality of polysilicon transistors, the first conductive layer comprises gate electrodes of the plurality of polysilicon transistors and a first plate of a storage capacitor, the second conductive layer comprises a second plate of the storage capacitor, the second semiconductor layer comprises active layers of a plurality of oxide transistors, the third conductive layer comprises gate electrodes of the plurality of oxide transistors, the fourth conductive layer comprises first electrodes and second electrodes of the plurality of polysilicon transistors; first electrodes and second electrodes of the plurality of oxide transistors and the first branch of the power supply line, and the fifth conductive layer comprises the second branch of the power supply line; there is an overlapping area between an orthographic projection of the second branch of the power supply line on the base substrate and an orthographic projection of the first branch of the power supply line on the base substrate, and there is an overlapping area between the orthographic projection of the second branch of the power supply line on the base substrate and an orthographic projection of the first gate driving circuit on the base substrate; and there is no overlapping area between the orthographic projection of the first branch of the power supply line on the base substrate and the orthographic projection of the first gate driving circuit on the base substrate.

19. The display substrate according to claim 6, wherein the second branch of the first high voltage line, the third branch of the second low voltage line, and the fourth branch of the second low voltage line are arranged in a same layer as the fifth conductive layer.

20. The display substrate according to claim 7, wherein the first connection electrode is connected with the third connection electrode, the fourth connection electrode and the fifth connection electrode through at least one via hole, respectively.

* * * * *